(12) United States Patent
Oh et al.

(10) Patent No.: US 11,563,030 B2
(45) Date of Patent: Jan. 24, 2023

(54) SEMICONDUCTOR MEMORY DEVICE AND MANUFACTURING METHOD THEREOF

(71) Applicant: SK hynix Inc., Gyeonggi-do (KR)

(72) Inventors: Sung-Lae Oh, Chungcheongbuk-do (KR); Dong-Hyuk Kim, Seoul (KR); Tae-Sung Park, Gyeonggi-do (KR); Soo-Nam Jung, Seoul (KR); Chang-Woon Choi, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 8 days.

(21) Appl. No.: 17/342,981

(22) Filed: Jun. 9, 2021

(65) Prior Publication Data
US 2021/0296362 A1    Sep. 23, 2021

Related U.S. Application Data

(62) Division of application No. 16/515,922, filed on Jul. 18, 2019, now Pat. No. 11,063,061.

(30) Foreign Application Priority Data

Nov. 19, 2018 (KR) .......................... 10-2018-0142264

(51) Int. Cl.
*H01L 27/11582* (2017.01)
*H01L 27/11573* (2017.01)
*H01L 21/311* (2006.01)
*H01L 21/02* (2006.01)
*H01L 23/528* (2006.01)

(52) U.S. Cl.
CPC ...... *H01L 27/11582* (2013.01); *H01L 21/022* (2013.01); *H01L 21/31111* (2013.01); *H01L 21/31144* (2013.01); *H01L 23/528* (2013.01); *H01L 27/11573* (2013.01)

(58) Field of Classification Search
CPC ......... H01L 27/11582; H01L 27/11573; H01L 21/31111; H01L 21/022; H01L 21/31144; H01L 23/528; H01L 27/11575; H01L 27/1157; H01L 27/11556; H01L 27/11524; G11C 16/0483; G11C 16/08
See application file for complete search history.

(56) References Cited

U.S. PATENT DOCUMENTS

2017/0317088 A1* 11/2017 Lee .................. H01L 27/11582

* cited by examiner

*Primary Examiner* — Julia Slutsker
(74) *Attorney, Agent, or Firm* — IP & T Group LLP

(57) ABSTRACT

A semiconductor memory device includes a stacked structure including a plurality of conductive layers and a plurality of interlayer insulating layers, which are alternately stacked on a substrate; stepped grooves provided in the stacked structure, the stepped grooves having different depths from each other; and an opening portion penetrating the stacked structure to contact the substrate and having steps on sidewalls, the steps having heights corresponding to depth differences between stepped grooves.

8 Claims, 28 Drawing Sheets

FIG.3
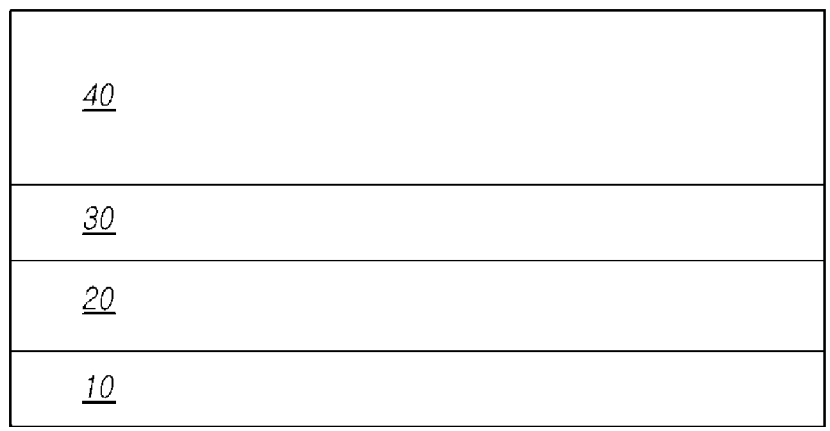
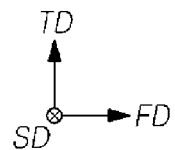

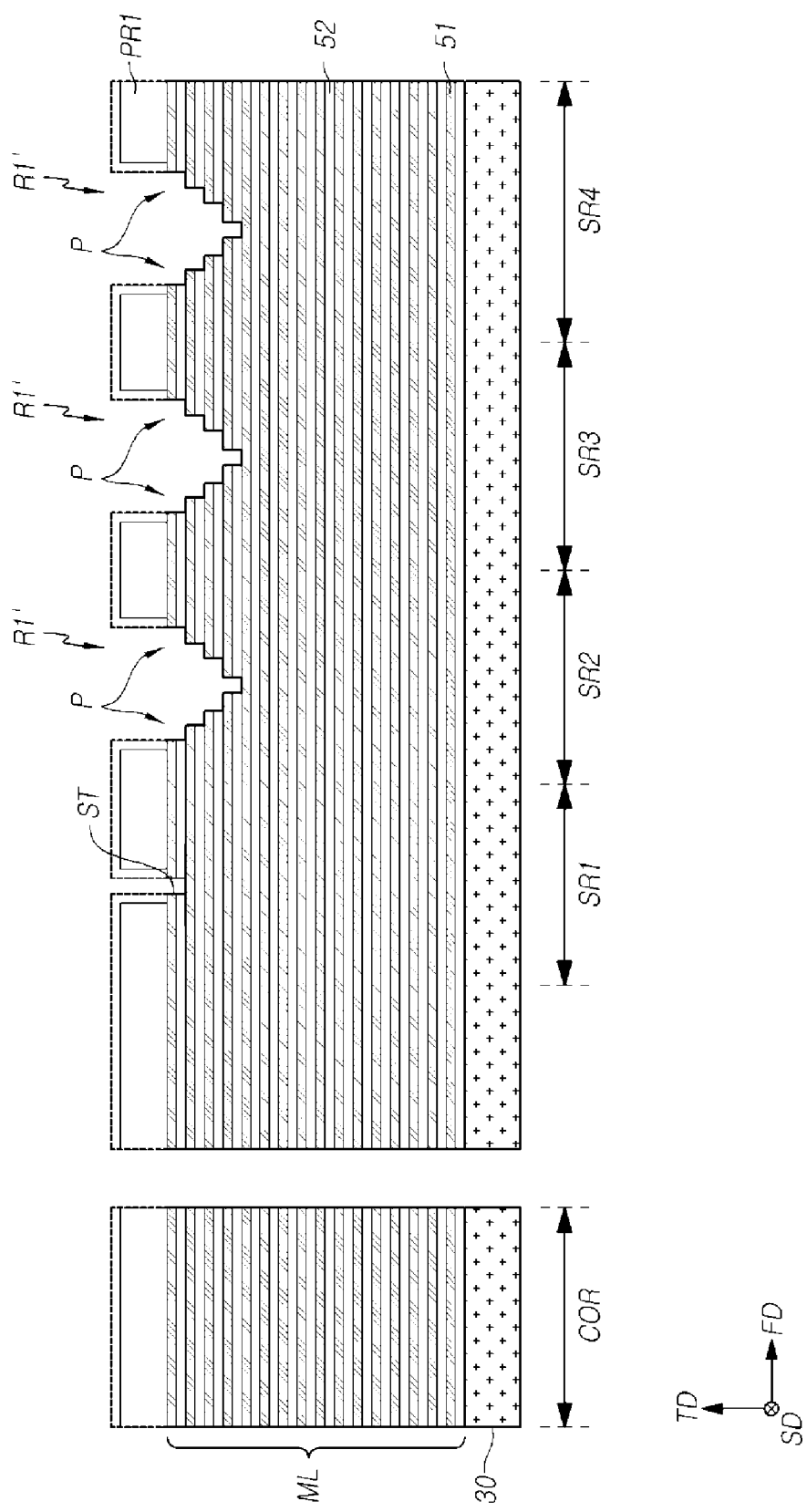

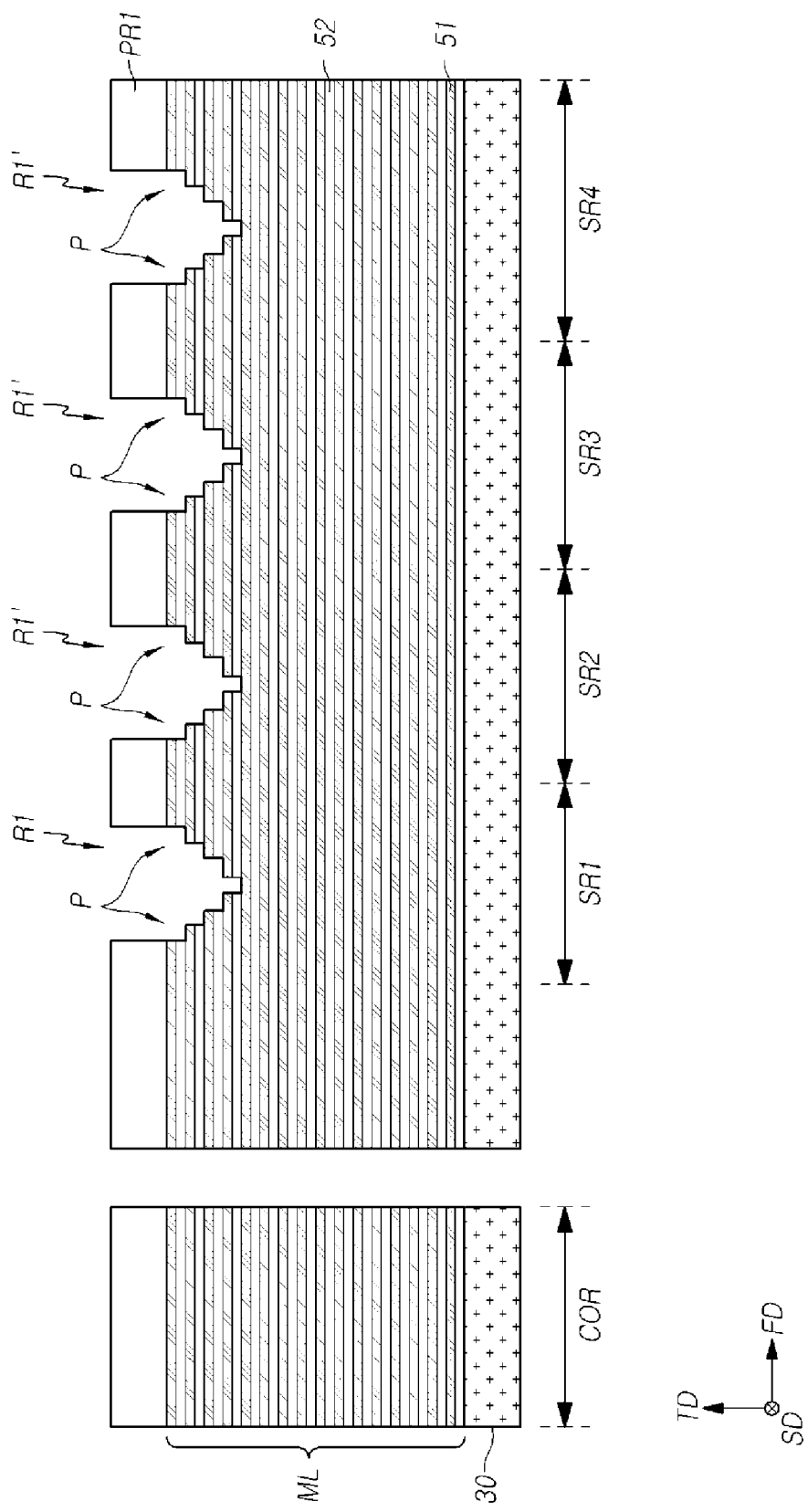

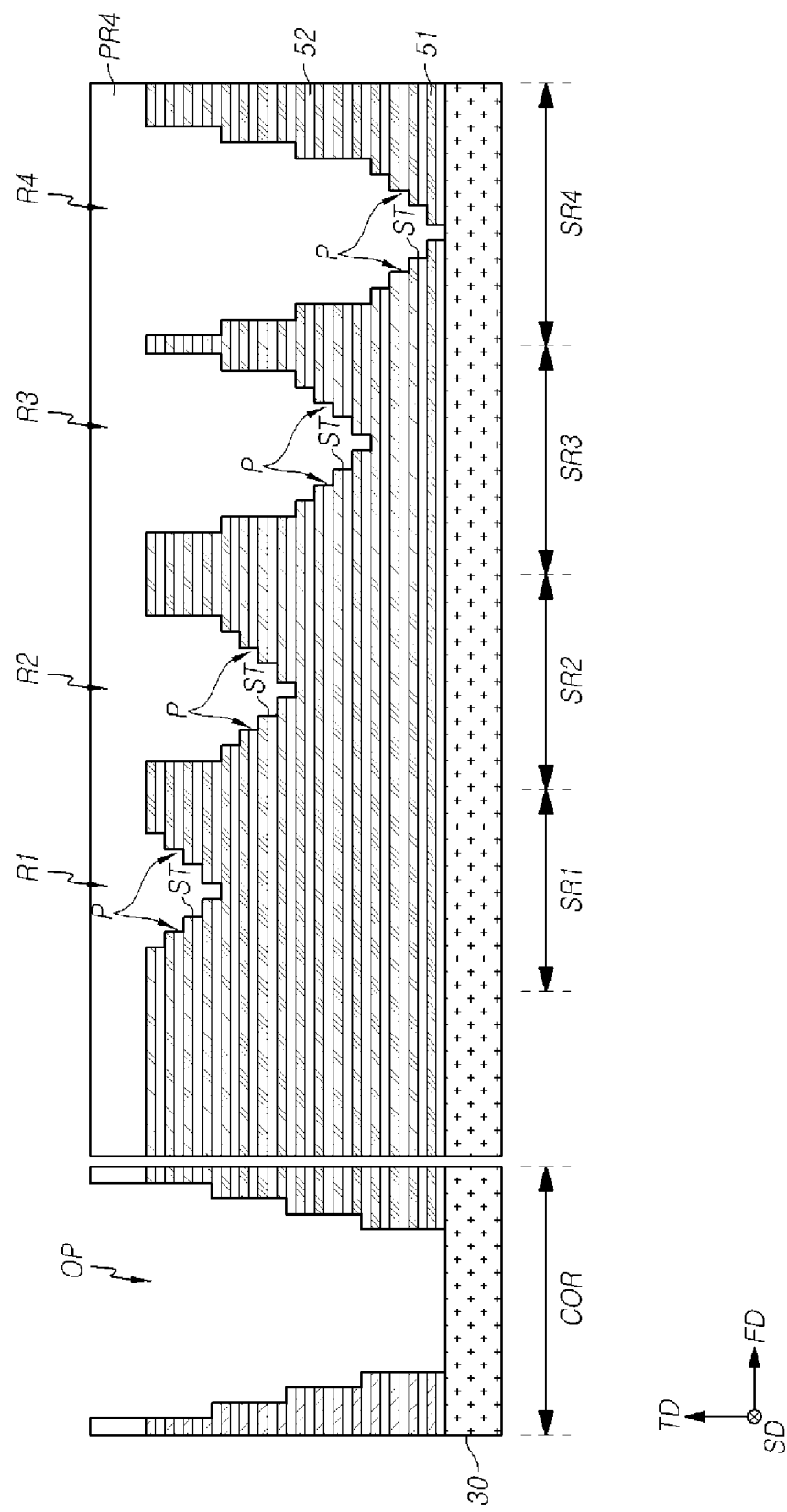

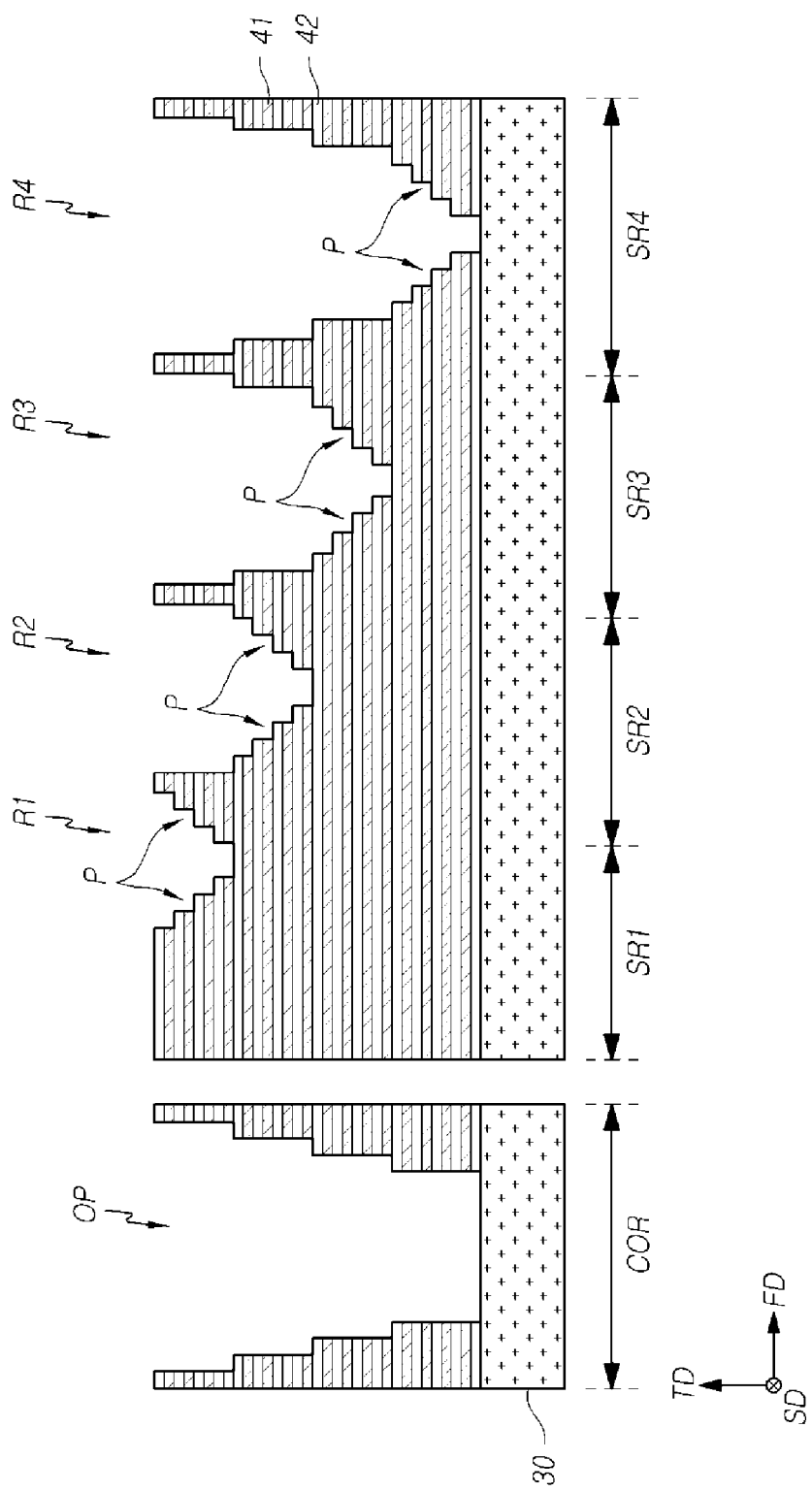

SEMICONDUCTOR MEMORY DEVICE AND MANUFACTURING METHOD THEREOF

CROSS-REFERENCE TO RELATED APPLICATION

This application is a division of U.S. patent application Ser. No. 16/515,922 filed on Jul. 18, 2019, which claims benefits of priority of Korean Patent Application No. 10-2018-0142264 filed on Nov. 19, 2018. The disclosure of each of the foregoing application is incorporated herein by reference in its entirety.

BACKGROUND

1. Technical Field

An aspect of the present disclosure relates to a semiconductor memory device and a manufacturing method thereof, and more particularly, to a three-dimensional (3-D) semiconductor memory device and a manufacturing method thereof.

2. Related Art

To meet excellent performance and low cost that consumers demand, there is a need to increase the integration of semiconductor memory devices. Integration of two-dimensional or planar memory devices is largely influenced by the level of fine pattern formation technology because it is determined by the area occupied by a unit memory cell. Further increases in the integration of two-dimensional semiconductor memory devices may be possible, but they are limited due to the high-cost of the equipment required to miniaturize the fine patterns.

To overcome this limitation, three-dimensional semiconductor memory devices in which unit memory cells are disposed in three-dimensions have been developed recently.

SUMMARY

In accordance with an aspect of the present disclosure, there is provided a three-dimensional semiconductor device.

In accordance with an embodiment of the three-dimensional semiconductor device, the semiconductor memory device may include a stacked structure including a plurality of conductive layers and a plurality of interlayer insulating layers, which are alternately stacked on a substrate; stepped grooves provided in the stacked structure, the stepped grooves having different depths from each other; and an opening portion penetrating the stacked structure to contact the substrate and having steps on sidewalls, the steps having heights corresponding to depth differences between stepped grooves.

In accordance with another embodiment of the three-dimensional semiconductor device, the semiconductor memory device may include a memory structure including a plurality of channel layers protruding in a vertical direction on a substrate, a plurality of interlayer insulating layers and a plurality of conductive layers which are alternately stacked along the channel layers on the substrate; a logic structure disposed on a base layer under the substrate and including a logic circuit and lower wiring lines electrically connected to the logic circuit; stepped grooves provided in a stacked structure including the interlayer insulating layers and the conductive layers, the stepped grooves having different depths from each other; an opening portion penetrating the stacked structure to contact the substrate and including steps on sidewalls, the steps having heights corresponding to depth differences between stepped grooves; and a contact plug penetrating an insulating layer filling in the opening portion and contacted to one of the lower wiring lines.

In accordance with another aspect of the present disclosure, there is provided a method of manufacturing a semiconductor device. The method may include forming a pre-stack by alternately stacking first material layers and second material layers on a substrate; forming a plurality of stepped grooves each having a step structure in the pre-stack; recessing the stepped grooves to have different depths from each other; forming an opening portion in the pre-stack, the opening portion have steps which have heights corresponding to depth differences between stepped grooves on sidewalls.

Other features and advantages of the invention will become apparent to those with ordinary skill in the art to which the invention belongs from the following description in conjunction with the accompanying drawings.

BRIEF DESCRIPTION OF THE DRAWINGS

FIG. 3 is a cross-sectional view illustrating a schematic structure of a semiconductor memory device in accordance with an embodiment of the present disclosure.

FIGS. 20A to 20G are cross-sectional views for explaining a method of forming a semiconductor memory device in accordance with an embodiment of the present disclosure.

DETAILED DESCRIPTION

Figure 1:
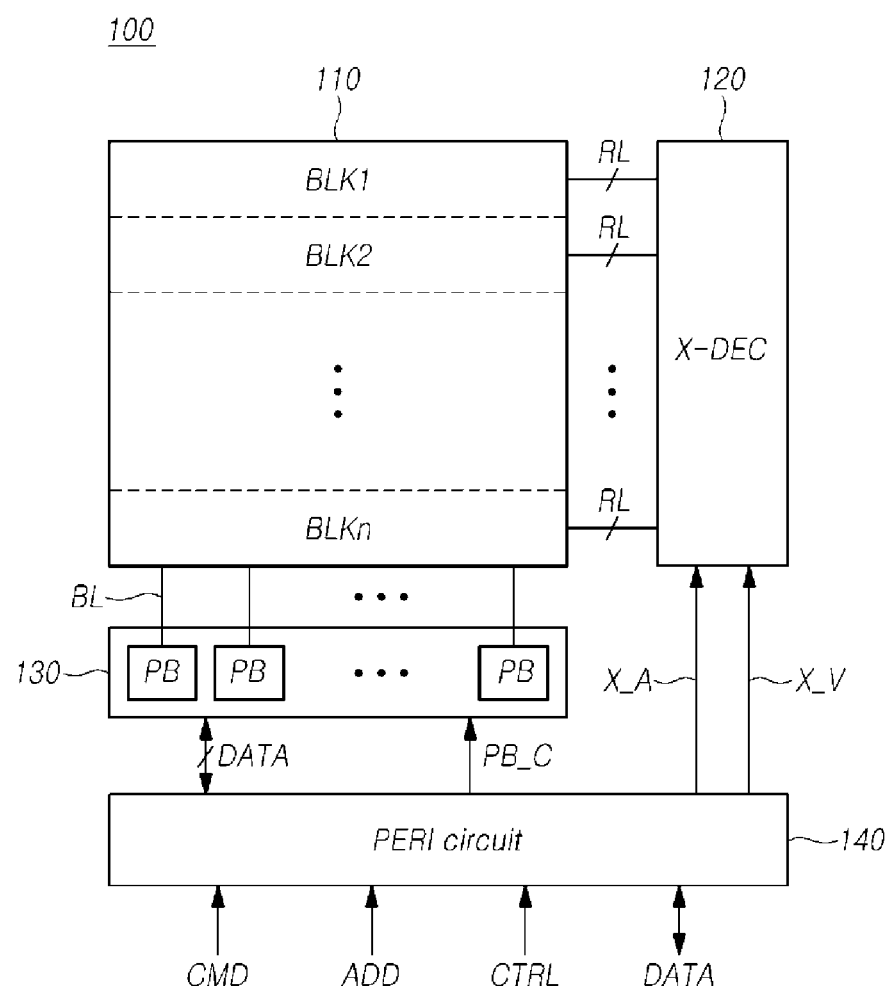
FIG. 1 is a block diagram illustrating an example of a semiconductor memory device in accordance with an embodiment of the present disclosure.

Hereinafter, a semiconductor memory device of a three-dimensional structure will be described below with reference to the accompanying drawings through various examples of embodiments. In the following embodiments described with reference to the drawings, substantially identical elements will be given the same names and the same reference numerals, and duplicate descriptions of the same elements will be omitted.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating an example of a semiconductor memory device in accordance with an embodiment.

Referring to FIG. 1, the memory device 100 in accordance with an embodiment may include a memory cell array 110, a row decoder 120, a page buffer circuit 130, and a peripheral circuit 140.

The memory cell array 110 may include a plurality of memory cells. The row decoder 120, the page buffer circuit 130, and the peripheral circuit 140 may function to control the operation of the memory cell array 110 and may be referred to as a logic circuit. The peripheral circuit 140 may refer to other components in the logic circuit except for the row decoder 120 and the page buffer circuit 130.

The memory cell array 110 may include a plurality of memory blocks BLK1 to BLKn. Each of the memory blocks BLK1 to BLKn may include a drain selection transistor (not shown) connected to a bit line, a source selection transistor (not shown) connected to a source line, and a plurality of memory cells connected between the drain selection transistor and the source selection transistor. The memory cell may be a volatile memory cell or a nonvolatile memory cell. Hereinafter, the semiconductor memory device 100 will be described as a three-dimensional, vertical type NAND flash device including nonvolatile memory cells, but the technical concepts of the present disclosure are not limited thereto.

The row decoder 120 may be coupled to the memory cell array 110 through row lines RL. The row lines RL may include one or more drain select lines, a plurality of word lines, and one or more source select lines. The row decoder 120 may select any one of the memory blocks BLK to BLKn of the memory cell array 110 according to address information. The row decoder 120 may transfer operating voltages X_V, such as program voltages, pass voltages and read voltages from the peripheral circuit 140, to the row lines RL coupled to the selected memory block. In order to transfer the operating voltages X_V to the row lines RL, the row decoder 120 may include a plurality of pass transistors coupled to row lines RL, respectively.

The page buffer circuit 130 may be coupled to the memory cell array 110 through a plurality of bit lines BL. The page buffer circuit 130 may include a plurality of page buffers PB, which are coupled to the bit lines BL, respectively. The page buffer circuit 130 may receive a page buffer control signal PB_C from the peripheral circuit 140, and may receive/transmit a data signal DATA from/to the peripheral circuit 140.

The page buffer circuit 130 may control the bit line BL coupled to the memory cell array 110 in response to the page buffer control signal PB_C. For example, the page buffer circuit 130 may sense a signal of the bit line BL of the memory cell array 110 in response to the page buffer control signal PB_C to detect the data stored in the memory cell of the memory cell array 110. The page buffer circuit 130 may transmit the data signal DATA to the peripheral circuit 140 according to the detected data. The page buffer circuit 130 may write the data to the memory cell of the memory cell array 110 by applying a signal to the bit line BL based on the data signal DATA received from the peripheral circuit 140 in response to the page buffer control signal PB_C. The page buffer circuit 130 may write the data to or read data from the memory cell coupled to the word line activated by the row decoder 120.

The peripheral circuit 140 may receive the command signal CMD, the address signal ADD and the control signal CTRL from the outside of the semiconductor memory device 100, and receive/transmit the data DATA from/to the memory controller. The peripheral circuit 140 may output signals for writing the data DATA to the memory cell array 110 or reading the data DATA from the memory cell array 110 based on the command signal CMD, the address signal ADD and the control signal CTRL. For example, the signals may be the row address X_A and the page buffer control signal PB_C. The peripheral circuit 140 may generate various voltages required in the semiconductor memory device 100 including the operating voltage X_V.

Hereinbelow, in the accompanying drawings, two directions parallel to the upper surface of the surface and intersecting with each other are defined as a first direction FD and a second direction SD. The first direction FD may correspond to the extending direction of the word lines or the arrangement direction of the bit lines, and the second direction SD may correspond to the extending direction of the bit lines or the arrangement direction of the word lines. The first direction FD and the second direction SD may intersect substantially perpendicular to each other. A vertical direction perpendicular to both the first and the second directions is defined as a third direction FD. In the drawings, a direction indicated by an arrow and a direction opposite thereto represent the same direction.

Figure 2:
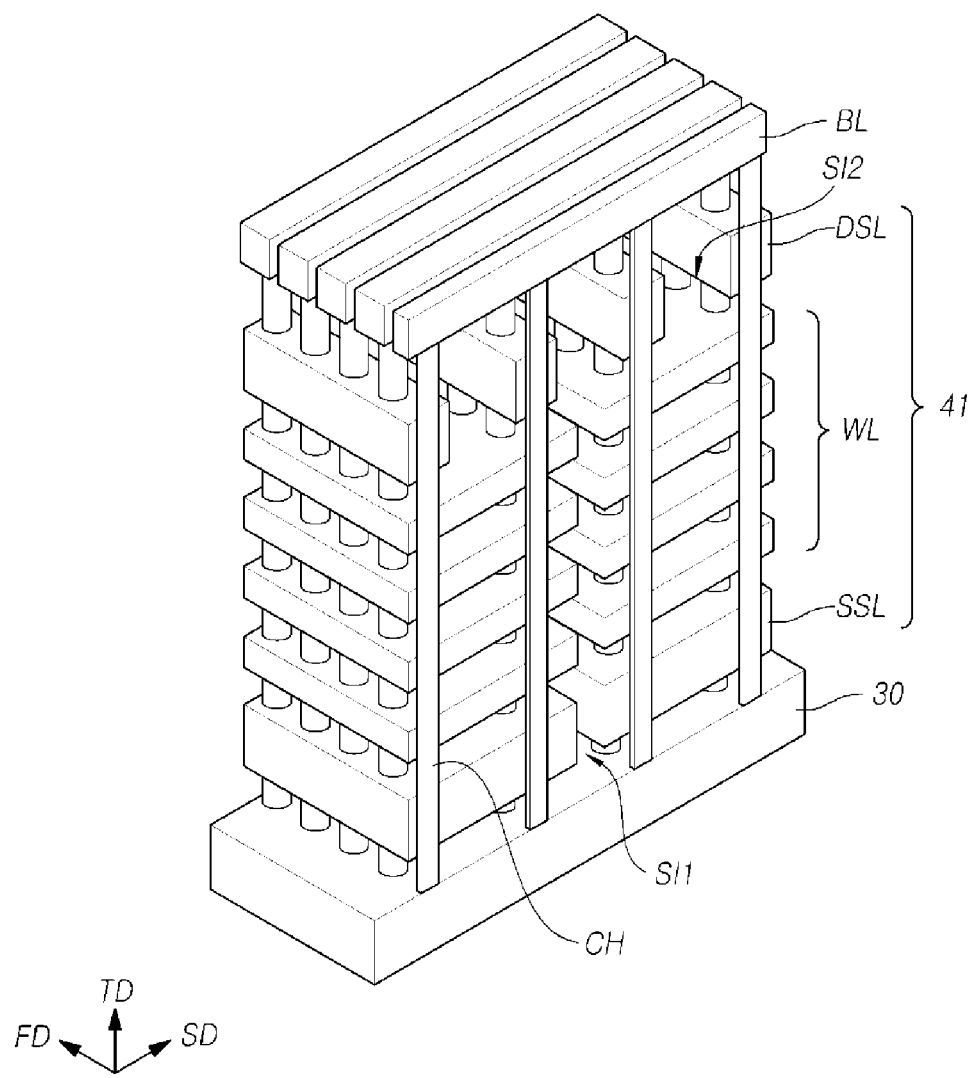
FIG. 2 is a perspective view illustrating a structure of memory strings of a semiconductor memory device in accordance with an embodiment of the present disclosure.

FIG. 2 is perspective view illustrating a structure of memory strings of a semiconductor memory device in accordance with an embodiment of the present disclosure. Referring to FIG. 2, a memory string may include a straight type channel layer CH.

The channel layer CH may extend from the substrate 30 in the third direction TD. The channel layer CH may be connected between the substrate 30 and a bit line BL. The channel layer CH may be electrically connected to the source area of the substrate 30. A plurality of channel layers CH may be arranged along the first and second directions FD and SD at regular intervals. A plurality of channel layers CH may be spaced apart along the first direction FD at a first regular interval. A plurality of channel layers CH may be spaced apart along the second direction SD at a second regular interval. The first and second regular intervals may be the same or different. The second regular interval may be greater than the first regular interval.

The channel layer CH is surrounded by conductive layers 41 stacked along the third direction TD while being spaced apart from each other. The conductive layers 41 are disposed between the substrate 30 and the bit line BL. The conductive layers 41 may include one or more source select lines SSL, a plurality of word lines WL stacked over the source select line SSL and one or more drain select lines DSL stacked over the word lines WL. The conductive layers 41 may be separated into two groups by a first slit SI1. The drain select line DSL may be separated, by a second slit SI2, into units smaller than those of the word lines WL and the source select line SSL. The conductive layers 41 may extend in the first and second directions FD and SD.

Although not shown in FIG. 2, the outer wall of the channel layers CH may be surrounded by a multi-layered memory layer including a tunnel insulating layer, a data storage layer, and a blocking insulating layer. Each of the conductive layers 41 surrounds the channel layers CH with the multi-layered memory layer interposed therebetween. According to the above-described structure, a source select transistor is disposed at an intersection portion of the source select line SSL and the channel layer CH. Memory cells are disposed at intersection portions of the word lines WL and the channel layer CH, respectively. A drain select transistor is disposed at an intersection portion of the drain select line DSL and the channel layer CH. Accordingly, the source select transistor, the memory cells and the drain select transistor, which are connected in series along the channel layer CH, may constitute a straight-type memory string. The memory string may be connected between the bit line BL and a source line to constitute a three-dimensional memory device.

The memory string, which are described in FIG. 2, may be straight-type, but the present disclosure is not limited thereto. For Example, the channel layer may be a U-shape. The source selection transistor, the memory cells and the drain selection transistor may be disposed along the U-shaped channel layer to form a U-shaped memory string.

FIG. 3 is a cross-sectional view illustrating a schematic structure of a semiconductor memory device in accordance with an embodiment of the present disclosure.

Referring to FIG. 3, a logic structure 20 is disposed over a lower substrate 10. An upper substrate 30 is disposed over the logic structure 20. The memory structure 40 may be disposed over the upper substrate 30.

The lower substrate 10 may also be defined as a base layer. The upper substrate 30 may be defined as a substrate that is the basis of the memory structure 40. In the following description, the 'base layer' will be used in substantially the same meaning as the lower substrate. The 'substrate' will be used in substantially the same meaning as the upper substrate.

The logic structure 20 may include a logic circuit and lower wiring lines connected to the logic circuit. The logic circuit may include the row decoder 120, the page buffer circuit 130 and peripheral circuitry 140 shown in FIG. 1. The memory structure 40 may include the memory cell array 110 shown in FIG. 1. The logic circuit including the row decoder 120, the page buffer circuit 130 and the peripheral circuit 140 may be disposed under the memory cell array 110. In other words, the semiconductor memory device 100 may have a PUC (Peri Under Cell) structure.

Figure 4:
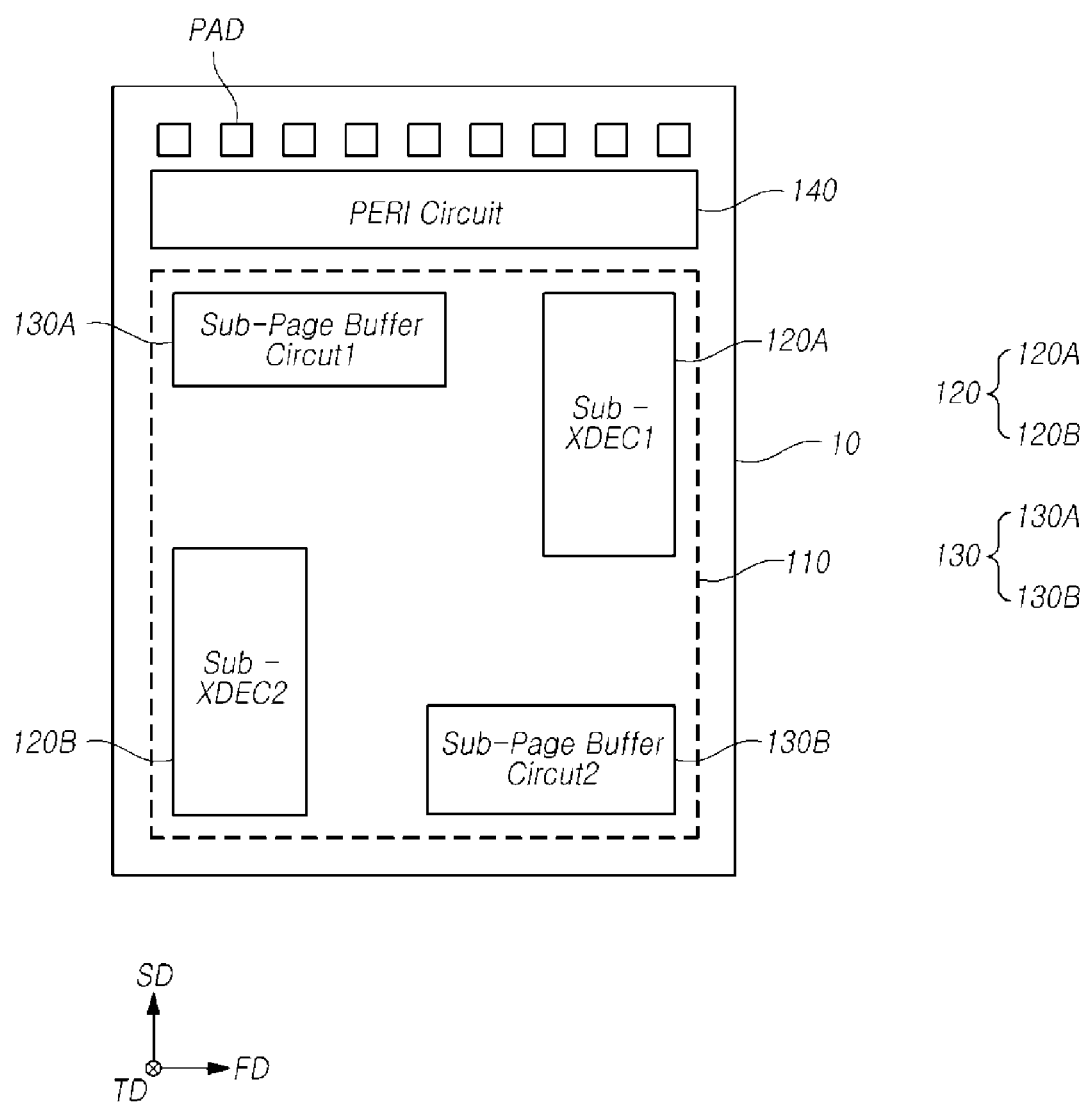
FIG. 4 is a plan view showing a schematic structure of a semiconductor memory device in accordance with an embodiment of the present disclosure.

FIG. 4 is a plan view showing a schematic structure of a semiconductor memory device in accordance with an embodiment of the present disclosure.

Referring to FIG. 4, at least a portion of the logic structure 20 of FIG. 3 may be disposed in an overlapping manner with the memory cell array 110 in the third direction TD. For example, the row decoder 120 and the page buffer circuit 130 may be overlapped with the memory cell array 110.

The row decoder 120 may be divided into a first sub-row decoder 120A and a second sub-row decoder 120B. The page buffer circuit 130 may be divided into a first sub-page buffer circuit 130A and a second sub-page buffer circuit 130B.

The first and second sub-row decoders 120A and 120B may be arranged to have an elongated shape with the long axis extending along the second direction SD, which is the arrangement direction of the word lines. The sum of the length of the first sub-decoder 120A and the length of the second sub-decoder 120B in the second direction SD may be substantially the same as the length of the memory cell array 110 in the second direction SD.

The first and second sub-page buffer circuits 130A and 130B may be arranged to have an elongated shape with the long axis extending along the first direction FD, which is an arrangement direction of bit lines. The sum of the length of the first sub-page buffer circuit 130A and the length of the second sub-page buffer circuit 130B in the first direction FD may be substantially the same as the length of the memory cell array 110 in the first direction FD.

All of the first and second sub-row decoders 120A and 120B and the first and second sub-page buffer circuits 130A and 130B may be overlapped with the memory cell array 110 in the third direction TD. More specifically, the sub-row decoders 120A and 120B, and the sub-page buffer circuits 130A and 130B may be arranged in an alternating order at the four corners of an area overlapping in the third direction TD with the memory cell array. Hence, as shown in FIG. 4, the first sub-row decoder 120A may be positioned at a right upper corner, the first sub-page buffer circuit 130A may be positioned at a left upper corner, the second sub-row decoder 120B may be positioned at a left lower corner, and the second sub-page buffer circuit 130B may be positioned at a right lower corner of the area overlapping in the third direction TD with the memory cell array. This configuration may be referred to herein as a windmill configuration. Although the present embodiment shows a case where the sub-row decoders 120A and 120B and the sub-page buffer circuits 130A and 130B are arranged on the corners of the area overlapping in the third direction TD with the memory cell array, but the invention is not limited in this way.

A plurality of input/output pads PAD may be arranged along the first direction FD at an edge of the base layer 10. The plurality of input/output pads PAD may be spaced apart along the first direction FD at a regular interval. The plurality of input/output pads PAD may be in a single row as shown in FIG. 4, however the invention is not limited in this way. The input/output pads PAD may be external contacts of the semiconductor memory device 100 for electrical connection with an external device. The peripheral circuit 140 may be disposed adjacent to the input/output pads PAD in the second direction SD. Although not shown, the peripheral circuit 140 may be electrically connected to the input/output pads PAD through a plurality of lines.

As described above, the memory cell array 110 may be overlapped with the row decoder 120 in the third direction TD. The memory cell array 110 may include a plurality of memory strings. The memory strings may have the structure described with reference to FIG. 2. Each of the conductive layers 41 in FIG. 2 of the memory cell array 110 may have a pad region which is exposed by another conductive film 41 disposed thereon and also of any interlayer insulating layer 42 so that vertical contacts may be landed on the pad regions of the conductive layers 41 and connected to the conductive layers, respectively. Routing lines electrically connected to the pass transistors (not shown) of the row decoder 120 may be connected to the contacts. Accordingly, the conductive layers 41 of the memory cell array 110 may be connected to the pass transistors of the row decoder 120 through the contacts and the routing lines. The memory cell array 110 may have a plurality of stepped grooves (See R1 to R4 in FIGS. 5 and 6) for exposing the pad regions of the conductive layers 41.

The memory cell array 110 may be overlapped with the logic circuit such as a row decoder 120 and a page buffer circuit 130. A lower wiring line UM (FIG. 7) electrically connected to the logic circuit may be disposed under the memory cell array 110. An upper wiring line TM (FIG. 7) may be disposed on the memory cell array 110. The upper wiring line TM may be connected to the lower wiring line UM through a contact plug CP. In other words, a contact plug CP may connect between the upper and lower wiring lines. This embodiment may have an opening portion in the memory cell array 110 to provide a space through which the contact plug passes.

Figure 5:
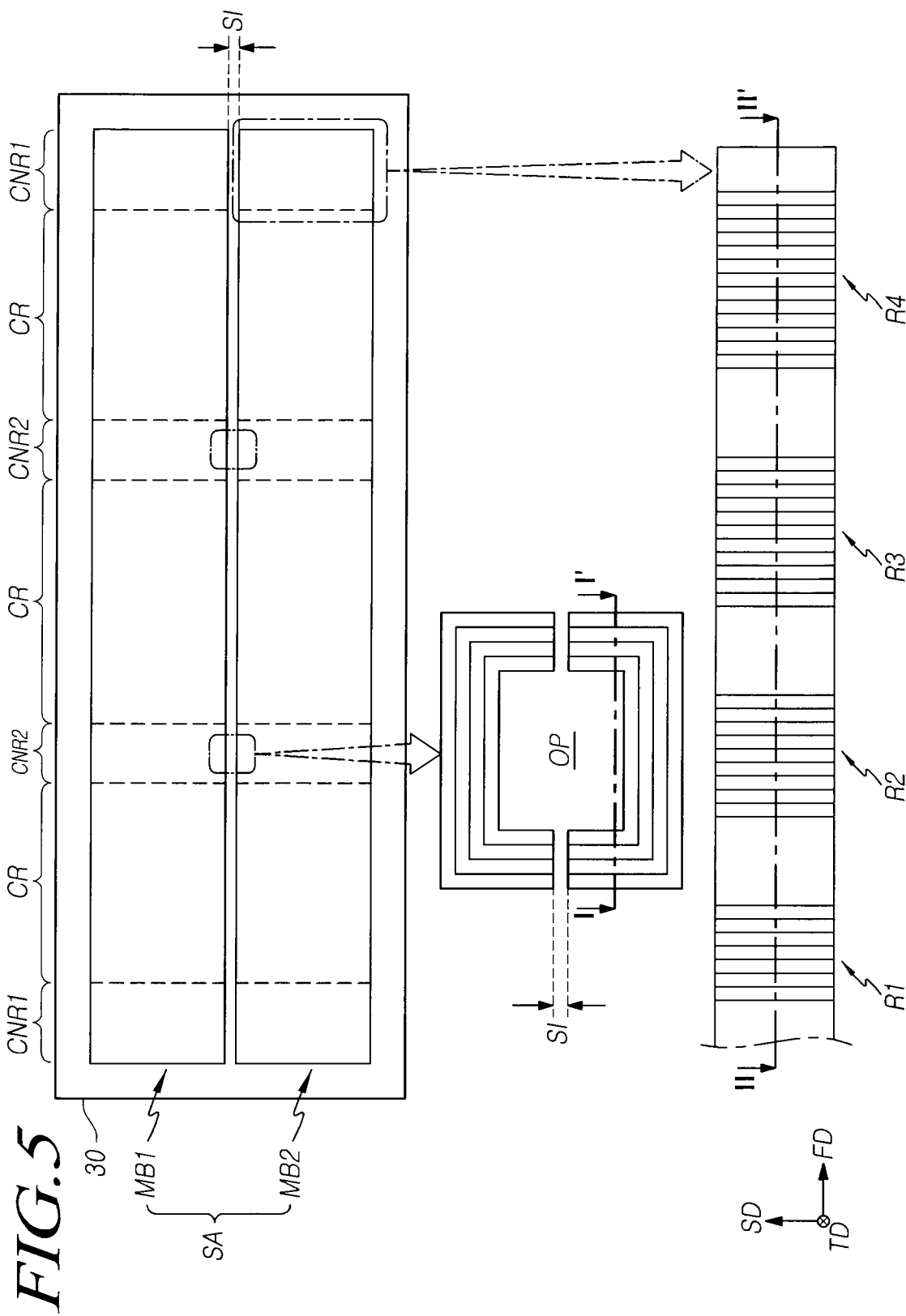
FIG. 5 is a plan view showing a stacked structure of a semiconductor memory device in accordance with an embodiment of the present disclosure.
Figure 6:
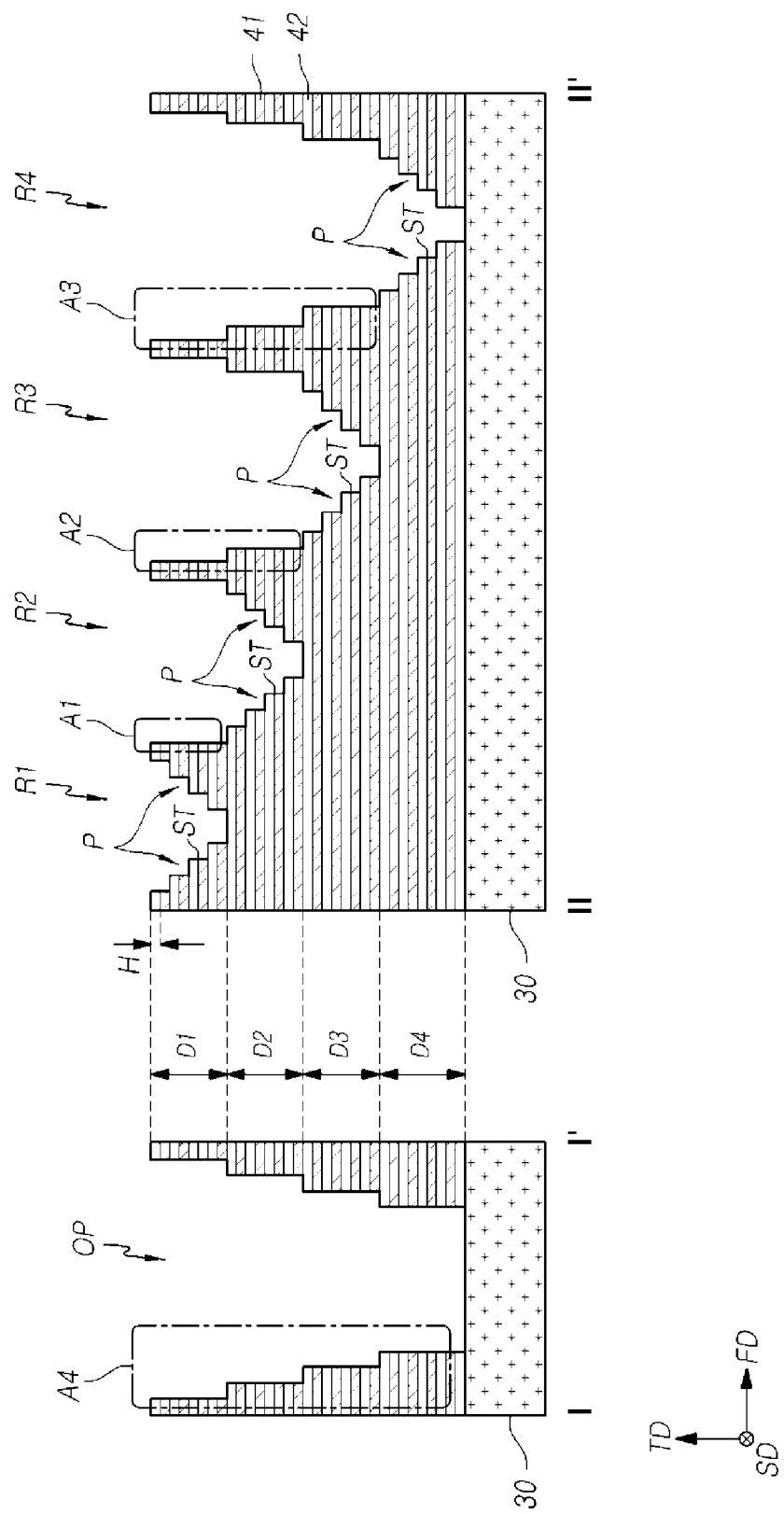
FIG. 6 is a cross-sectional view taken along line I-I' and II-II' of FIG. 5.

FIG. 5 is a plan view showing a semiconductor memory device in accordance with an embodiment of the present disclosure. FIG. 6 shows a cross-sectional view taken along lines I-I' and II-II' of FIG. 5.

Referring to FIGS. 5 and 6, the semiconductor memory device in accordance with an embodiment of the present disclosure may include stacked structure SA, stepped grooves R1 to R4 and opening portion OP.

The stacked structure SA may include first and second memory blocks MB1 and MB2 disposed adjacent one another in the second direction SD. The first and the second memory blocks MB1 and MB2 may be separated each other by a slit SI extending in the first direction FD when viewed from the top. Each of the first and the second memory blocks MB1 and MB2 may include a plurality of conductive layers 41 and a plurality of interlayer insulating layers 42, which are alternately stacked along the third direction TD on a substrate 30.

The substrate 30 may include a pair of first connection regions CNR1, a plurality of cell regions CR, and a plurality of second connection regions CNR2. The first connection regions CNR1 are spaced apart each other and positioned at opposite ends of the substrate 30. The cell regions CR and the second connection regions CNR2 are alternately disposed between the first connection regions CNR1. In FIG. 5, the regions CNR1, CR, CNR2, CNR2, CR, CNR2 and CNR1 are arranged consecutively in the stated order along the first direction FD.

The first and the second memory blocks MB1 and MB2 are disposed on the cell regions CR, the first and the second connection regions CNR1 and CNR2. Both ends of the first and the second blocks MB1 and MB2 may be located at the first connection regions CNR1.

The stepped grooves R1 to R4 and the opening portions OP are disposed in the stacked structure SA. For example, the first and second memory blocks MB1 and MB2 may be provided with a plurality of stepped grooves R1 to R4 and an opening portions OP. The stepped grooves R1 to R4 may be disposed in the first connection regions CNR1. The opening portions OP may be disposed over the second connection regions CNR2.

Each of the stepped grooves R1 to R4 may include step structures P with a plurality of steps ST on both side surfaces of each groove in the first direction FD. The step structures P on both sides of each grove may include the same number of steps. The height H of each of the steps ST may be the same as the vertical pitch of the conductive layers 41. Stated otherwise, the height of each step is equal to the sum of the thicknesses of one conductive layer 41 and an interlayer insulating layer 42. Hereinafter, for convenience of description, the stepped grooves R1 to R4 will be referred to as first to fourth stepped grooves.

The first to the fourth stepped grooves R1 to R4 may have different depths from each other. The first stepped groove R1 may have a first depth of D1. The second stepped groove R2 may have a depth corresponding to the sum of the first depth D1 and a second depth D2. The second depth D2 may correspond to the difference between the depth of the second stepped groove R2 and the depth of the first stepped groove R1. The third stepped groove R3 may have a depth corresponding to the sum of the first depth D1, the second depth D2 and a third depth D3. The third depth D3 may correspond to the difference between the depth of the third stepped groove R3 and the depth of the second stepped groove R2. The fourth stepped groove R4 may have a depth corresponding to the sum of the first depth D1, the second depth D2, the third depth D3 and a fourth depth D4. The fourth depth D4 may correspond to the difference between the depth of the fourth stepped groove R4 and the depth of the third stepped groove R3.

The second stepped groove R2 may have one side step A1 on the both side walls in the first direction FD. The side step A1 may have a height equal to the first depth D1. The opening width of the second stepped groove R2 in the first direction may be greater than the opening width of the first stepped groove R1 in the first direction.

The third stepped groove R3 may have two side steps A2 on the both side walls in the first direction FD. The two side steps A2 may have heights corresponding to the first depth D1 and the second depth D2, respectively. The opening width of the third stepped groove R3 in the first direction may be greater than the opening width of the second stepped groove R2 in the first direction.

The fourth stepped groove R4 may have three side steps A3 on the both side walls in the first direction FD. The three side steps A3 may have heights corresponding to the first depth D1, the second depth D2 and the third depth D3, respectively. The opening width of the fourth stepped groove R4 in the first direction may be greater than the opening width of the third stepped groove R3 in the first direction. It is noted that opening width refers to the largest width of a groove in the first direction.

In the above-described embodiment the number of the stepped grooves R1 to R4 is four, and the number of the steps of each step structures P is four, however, the invention is not limited in this way. Also, in the above-described embodiment the number of the steps of the step structures P is equal to each other, however, it is noted that in variations of this embodiment the number of the steps of the step structures P in each groove may be different from each other.

Each of the opening portions OP may be connected to the substrate 30 through the first and the second memory blocks MB1 and MB2. Each opening portion OP may provide space for a contact plug CP to pass through. The contact plug CP may connect the upper wiring line TM (FIG. 7) over the first and second memory blocks MB1 and MB2 to the lower wiring line UM (FIG. 7) under the first and second memory blocks MB1 and MB2. The contact plug CP may connect the upper wiring line TM over the first and second memory blocks MB1 and MB2 to the substrate 30 under the first and second memory blocks MB1 and MB2.

When the opening portion OP is formed by a process different from the stepped grooves R1 to R4, a mask forming process and an etching process must be separately performed to form the opening portion OP, thereby the number of process steps will be increase. Increasing the number of process steps may result in an increased manufacturing time, a lower through put, and an increased manufacturing cost.

In addition, when the opening portion OP penetrating through the first and the second memory blocks MB1 and MB2 is formed by a single etching process, the pattern around the opening portion OP may be collapsed during the etching process, which may lead to an increase of the defect rate and a decrease of the yield.

In accordance with an embodiment of the present invention, the opening portion OP may be formed through a process for etching the second to fourth stepped grooves R2 to R4. Due to this manufacturing feature, the opening portion OP may include four side steps A4 on the side wall, each of which has a height corresponding to the depth differences between the second to the fourth stepped grooves R2 to R4, respectively. The four side steps A4 may be provided on sidewalls of the opening portion OP. Specifically, the four side steps A4 may have a height corresponding to the first depth D1, the second depth D2, the third depth D3 and the fourth depth D4, respectively.

The opening portion OP may have an inverted pyramid shape in which the width of the first and the second direction FD and SD increase as the vertical distance from the substrate 30 increases. Due to an inverted pyramid shape of the opening portion OP, the conductive layers 41 and the interlayer insulating layers 42 around the opening portion OP may be structurally stable. Therefore, the collapse of the conductive layers 41 and the interlayer insulating layers 42 around the opening portion OP may be suppressed and the defects may be reduced.

Since, the opening portion OP is simultaneously formed through the process of etching the second to fourth stepped grooves R2 to R4, a separate mask forming process and a separate etching process are not required to form the opening portion OP. Therefore, the number of process steps is reduced, the manufacturing time and manufacturing cost of the semiconductor memory device can be decreased. Since the opening portions OP are formed by several etching processes, the depth required to be etched in the single etching process is reduced, so that pattern collapse that occurs during the etching process can be suppressed and the yield of the semiconductor memory device can be improved.

In an embodiment, the opening portions OP are exposed at the sides of the first and second memory blocks MB1 and MB2, and are contacted with the slit SI for separating the first and second memory blocks MB1 and MB2. In this specification, the structure of such an opening portion OP will be defined as an open structure.

The opening portion OP extends in the second direction SD from one side of the first memory block MB1 which is in contact with the slit SI towards the opposite side of the first memory block MB1 but and does not reach the opposite side thereof. The opening portion OP also extends in the second direction SD from one side of the second memory block MB2 which is in contact with the slit SI towards the opposite side of the second memory block MB2 but and does not reach the opposite side thereof. The slit SI cuts the opening OP in two equal parts in the second direction. The size of the opening portion OP in the second direction is only a small fraction of the width of each memory block MB1 and MB2 and, although, its size may vary by design choice, the opening portion OP does not divide the conductive layers 41 and the interlayer insulating layers 42 of the first and second memory blocks MB1 and MB2 in the second direction SD.

Unlike the opening portion OP, the first to fourth stepped grooves R1 to R4 may cross the first and second memory blocks MB1 and MB2 in the second direction SD and may divide some of the conductive layers 41 and the interlayer insulating layers 42 included in the first and second memory blocks MB1 and MB2 in the second direction SD. The conductive layers 41 of the cell regions CR in the single memory block must have the same potential as those located in the same layer. Accordingly, in the case where the first to fourth stepped grooves R1 to R4 are disposed at the second connection region CNR1 between the cell regions CR, and the conductive layers 41 are divided by the first to fourth stepped grooves R1 to R4, the additional wiring lines for connecting between the divided conductive layers 41 are required. When the first to fourth stepped grooves R1 to R4 are disposed at the end of the first and second memory blocks MB1 and MB2 arranged on the first connection region CNR1 as in the present embodiment, even if the conductive layers 41 of the first and second memory blocks MB1 and MB2 are divided by the first to fourth stepped grooves R1 to R4, it is not necessary to connect between the divided conductive layers 41. Therefore, no additional wiring line for connecting between the divided conductive layers 41 is required.

Figure 7:
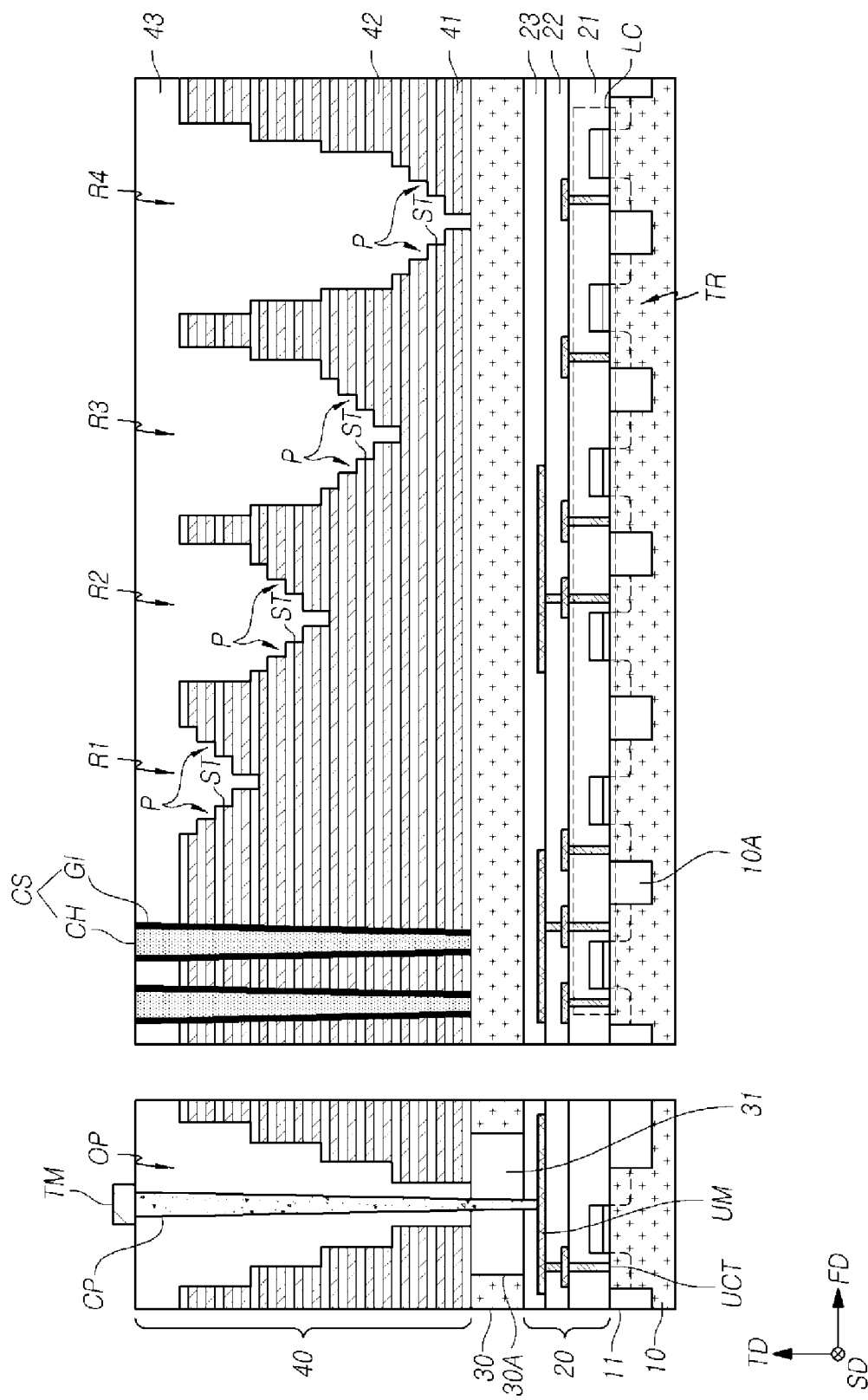
FIG. 7 is a cross-sectional view of a semiconductor memory device in accordance with an embodiment of the present disclosure.

FIG. 7 is a cross-sectional view of a semiconductor memory device in accordance with an embodiment of the present disclosure.

Referring to FIG. 7, a semiconductor memory device in accordance with an embodiment of the present disclosure may include a memory structure 40, a logic structure 20, stepped grooves R1 to R4, an opening portion OP and a contact plug CP.

The logic structure 20 may be disposed on a base layer 10. The base layer 10 may be a semiconductor substrate having a first type conductivity, for example, a P-type conductivity. The semiconductor substrate as the base layer may include, for example, at least one selected from the group including a monocrystalline silicon layer, an SOI (silicon on insulator), a silicon layer formed on a silicon germanium (SiGe) layer, a monocrystalline silicon layer formed on an insulating layer and a polysilicon layer formed on an insulating layer.

The logic structure 20 may include, for example, a logic circuit LC, lower wiring lines UM and lower contacts UCT electrically connected to the logic circuit LC, and lower insulating layers 21 to 23.

The logic circuit LC may include a plurality of transistors TR. The transistors TR may constitute the row decoder 120, the page buffer circuit 130 and the peripheral circuit 140 described above with reference to FIGS. 1 and 4. The transistors TR may be disposed in the active region defined by the isolation layer 10A.

The lower insulating layers 21 to 23 may be provided on the base layer 10 to cover the logic circuit LC. The lower insulating layer 21 to 23 may include a silicon oxide layer, a silicon nitride layer, or a silicon oxynitride layer. The lower insulating layers 21 to 23 may include first to third lower insulating layers 21 to 23, but the present disclosure is not limited thereto.

The lower insulating layers 21 to 23 may be stacked one on top of the other with the lower insulating layer 21 formed on the base layer 10, the lower insulating layer 22 formed on the lower insulating layer 21, and the lower insulating layer 23 formed on the lower insulating layer 22.

The lower wiring lines UM may be disposed on the lower insulating layers 21 and 22. More specifically, some of the lower wiring lines UM may be disposed on the lower insulating layer 21 and some may be disposed on the lower insulating layer 22. The lower wiring lines UM may be connected to the logic circuit LC through the lower contacts UCT passing through the lower insulating layers 21 and 22. The lower contacts UCT may be elongated members extending in the third direction TD. Some of the lower wiring lines UM that are disposed on the lower insulating layer 22 may be connected with at least one lower wiring line UM disposed on the lower insulating layer 21 via a lower contact UCT. It is further noted that the configuration of the lower wiring lines UM and the lower contacts UCT may change by design and is not limited in the one shown in FIG. 7. The lower wiring lines UM and the lower contacts UCT may be formed of any suitable conductive material. A suitable conductive material may be a tungsten or a metal containing tungsten.

The substrate 30 may be disposed on the third lower insulating layer 23. The substrate 30 may be composed of silicon such as polycrystalline silicon. Unlike the base layer 10 in which monocrystalline silicon can be used, the substrate 30 may be composed of polycrystalline silicon since it must be formed on the third lower insulating layer 23.

The memory structure 40 may be disposed on the substrate 30. The memory structure 40 may include a plurality of channel structures CS projecting in the third direction TD on the substrate 30 through the stack of conductive layers 41 and interlayer insulating layers 42. The plurality of conductive layers 41 and the plurality of interlayer insulating layers 42 may be alternately stacked along the channel structure CS on the substrate 30.

The first to fourth stepped grooves R1 to R4 and the opening portion OP may be provided in the conductive layers 41 and the interlayer insulating layers 42. Since the first to fourth stepped grooves R1 to R4 and the opening portion OP have been already described with reference to FIGS. 5 and 6, a duplicate description of the same configuration will be omitted.

The substrate 30 may have an opening 30A for exposing the third lower insulating layer 23 in an area overlapping with the opening portion OP in the vertical direction. Insulating layer 31 may fill the space of the opening 30A.

The upper insulating layer 43 may be provided on the memory structure 40. The first to fourth stepped grooves R1 to R4 may be filled with the upper insulating layer 43.

The channel structures CS may rise above the top interlayer insulating layer 42 and may have a top surface at the same height as the top surface of the upper insulating layer 43. The channel structures CS may pass through the upper insulating layer 43, the stack of alternating conductive layers 41 and interlayer insulating layers 42 and may be connected to the substrate 30. The channel structures CS may pass through the upper insulating layer 43, the conductive layers 41 and the interlayer insulating layers 42 in the third direction TD to contact the top surface of the substrate 30. Each of the channel structures CS may include a channel layer CH and a gate insulating layer GI. The channel layer CH may be made of any suitable material including polysilicon or monocrystalline silicon, and may also include in some regions thereof an impurity such as a P-type impurity, for example, boron (B). The channel layer CH may have the shape of a pillar or the shape of a solid cylinder which is completely filled up to its center. While not shown, in a variation of the illustrated embodiment, the channel layer CH may have the shape of a tube having an open center region. A buried insulating layer may be formed in the open center region of the channel layer CH. The channel layer CH may have a gradually tapered shape having its largest cross-section at its top surface and its smallest cross-section at its bottom surface. The cross-section of the channel layer may be cylindrical, however, the invention is not limited in this way and other cross-sectional shapes may also be employed.

The gate insulating layer GI may be formed conformally on the channel layer CH and may surround the entire outer surface of the channel layer CH. The gate insulating layer GI may have the shape of a straw or a cylinder shell which surrounds the outer wall of the channel layer CH. The gate insulating layer GI may include a tunnel insulating layer, a charge storage layer and a blocking layer sequentially stacked from the outer wall of the channel layer CH all of which are well known in the art, thus, they will not be described herein in detail. For example, in some embodiments, the gate insulating layer GI may have an ONO (oxide-nitride-oxide) stack structure in which an oxide layer, a nitride layer and an oxide layer are sequentially stacked.

The upper wiring lines TM may be disposed on the upper insulating layer 43. The upper wring lines TM may be connected with the lower wiring lines UM by the contact plug CP passing through an upper insulating layer 43 filled in the opening portion OP, the insulating layer 31 and the third lower insulating layer 23.

FIGS. 8 to 17 are plan views showing a semiconductor memory device in accordance with various embodiments of the present disclosure.

Figure 8:
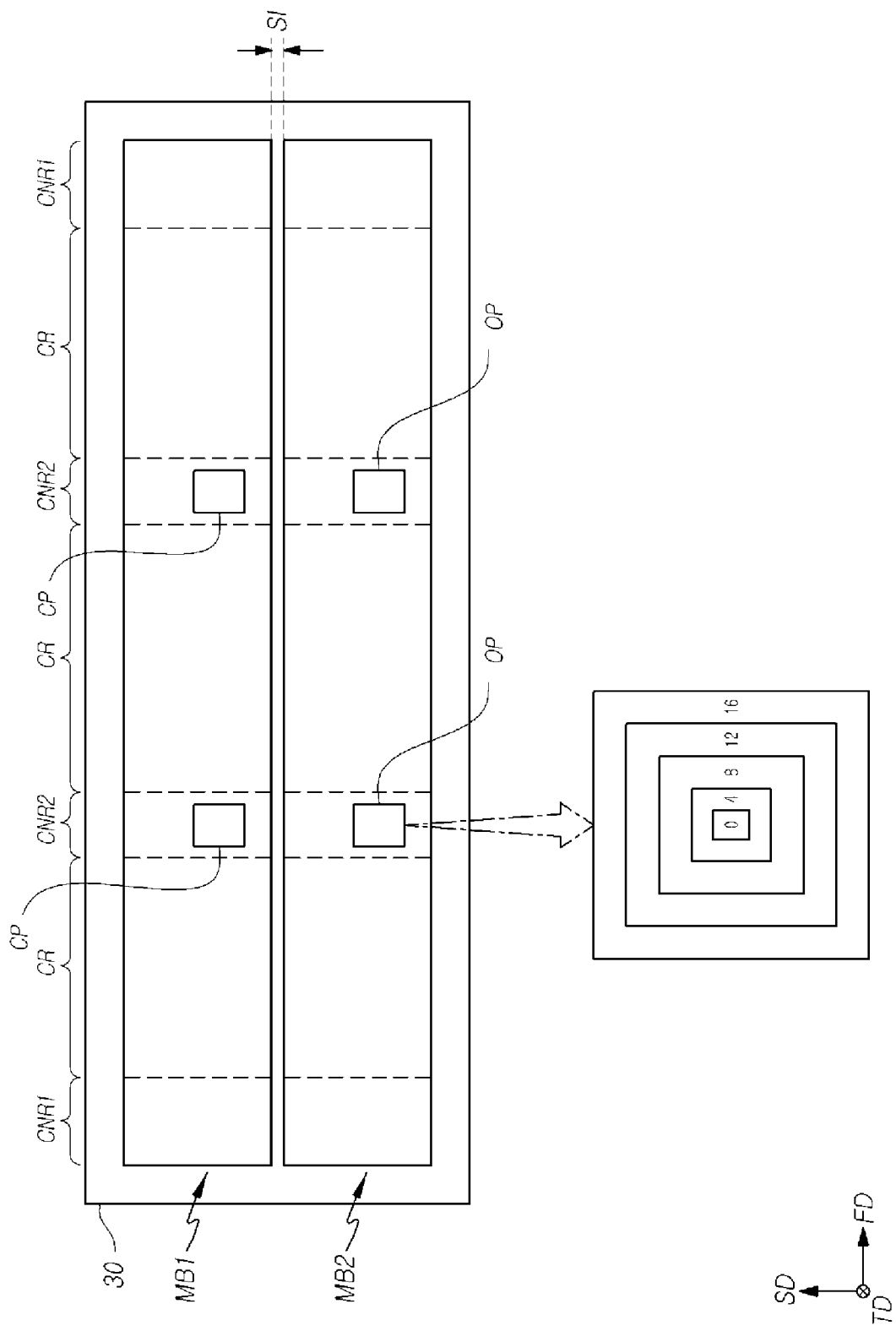
FIGS. 8 to 17 are plan views showing semiconductor memory devices in accordance with various embodiments of the present disclosure.

Referring to FIG. 8, the opening portion OP may be disposed both inside the first and second memory block MB1 or MB2. Also, as illustrated in FIG. 8 the opening portion OP may not be exposed to the sides of the first and second memory blocks MB1 and MB2. In this case, the opening portion OP is not connected to the slit SI separating the first and second memory blocks MB1 and MB2. The conductive layers 41 and the interlayer insulating layers 42 of the first and second memory blocks MB1 and MB2 may not be divided by opening portion OP. In this specification, the structure of such an opening portion OP will be defined as a closed structure.

Figure 9:
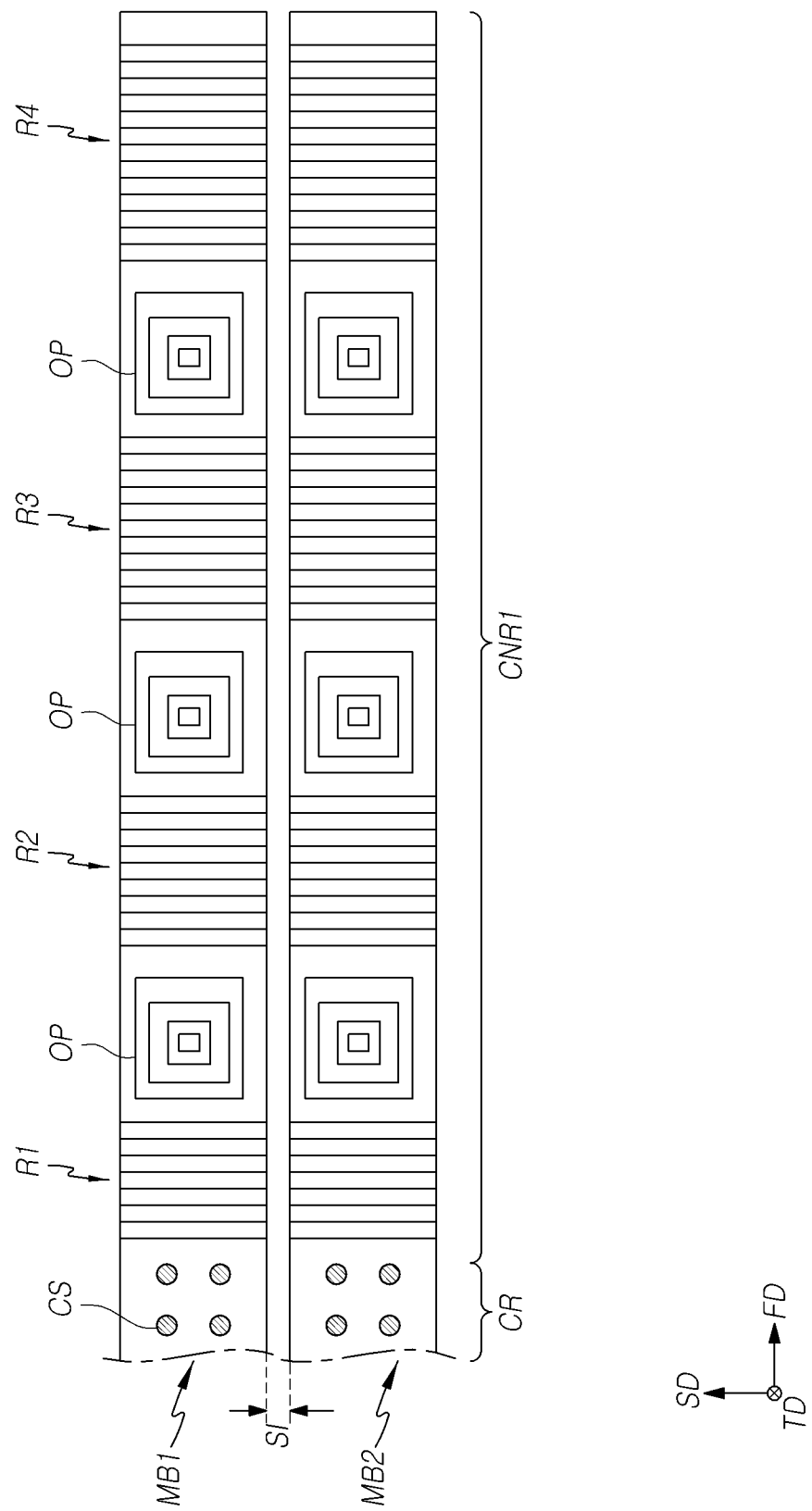
Figure 10:
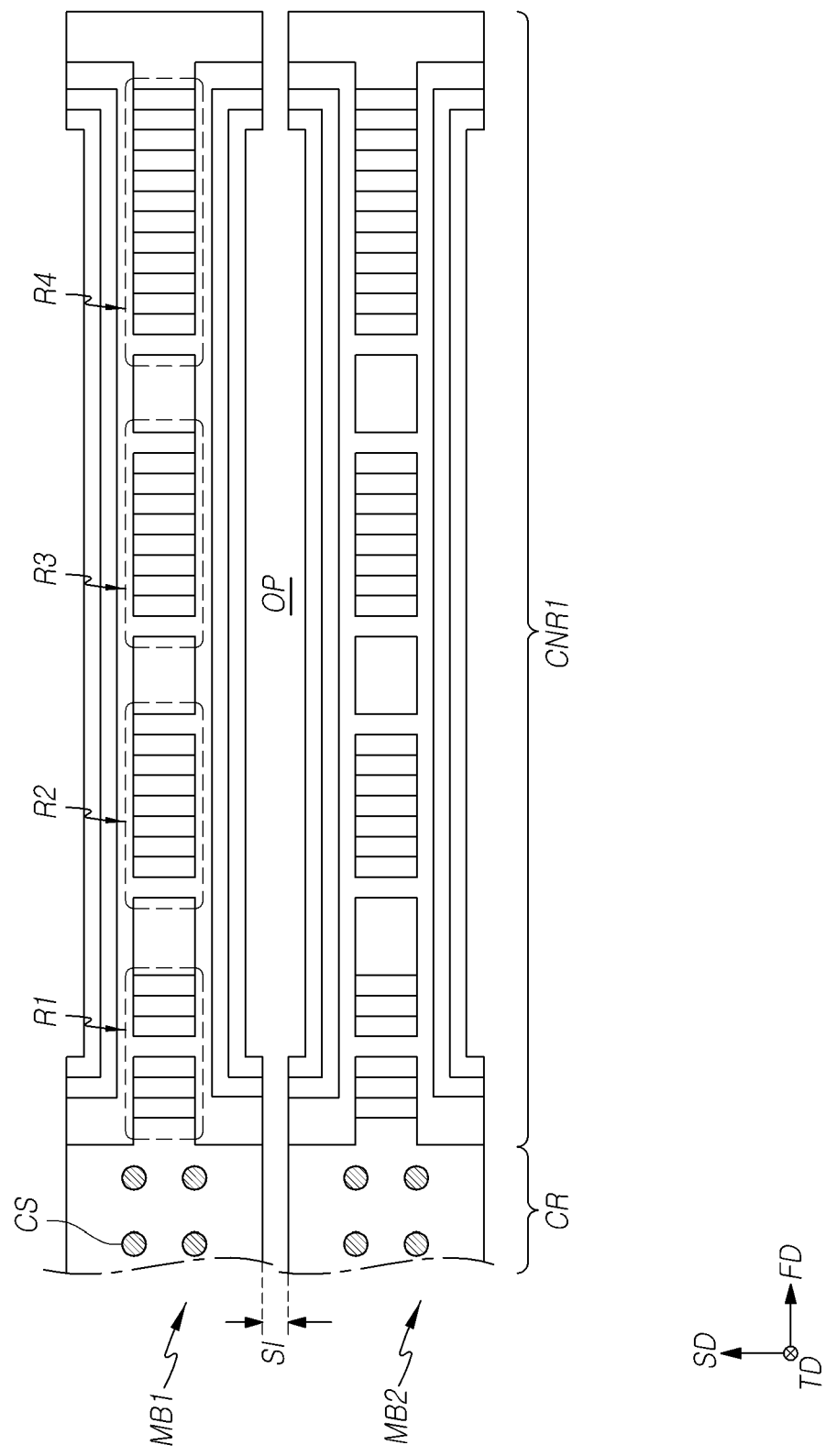

Referring to FIG. 9, the opening portions OP and the stepped grooves R1 to R4 may be disposed at the end portions of the first and second memory blocks MB1 and MB2 in the first connection region CNR1. The opening portions OP and the stepped grooves R1 to R4 may be alternately arranged along the first direction FD.

The opening portions OP may be disposed inside the first and second memory blocks MB1 and MB2 and may not be exposed to the sides of the first and second memory blocks MB1 and MB2. The opening portions OP may have the above-mentioned closed structure.

The stepped grooves R1 to R4 may pass through the first and second memory blocks MB1 and MB2 in the second direction SD. The first to the fourth stepped grooves R1 to R4 may divide at least one conductive layer 41 included in the first and second memory blocks MB1 and MB2. When the first to the fourth stepped grooves R1 to R4 are disposed at the end portions of the first and second memory blocks MB1 and MB2 as described with reference to FIG. 5, even if the conductive layers 41 of the first and second memory blocks MB1 and MB2 are divided by the fourth stepped grooves R1 to R4, there is no need to connect between the divided conductive layers 41. Therefore, no additional wiring line for connecting between the divided conductive layers 41 is required.

Referring to 10, the opening portions OP and the stepped grooves R1 to R4 are disposed at the end portions of the first and second memory blocks MB1 and MB2 in the first connection region CNR1.

The stepped grooves R1 to R4 may be arranged along the first direction FD. The opening portions OP are disposed on both sides of the stepped grooves R1 to R4 in the second direction SD and may be connected to the stepped grooves R1 to R4. The opening portions OP may be exposed at the sides of the first and second memory blocks MB1 and MB2, and connected to a slit SI which separates the first and second memory blocks MB1 and MB2. The opening portions OP may have the above-mentioned open structure. Each of the opening portions OP of FIG. 10 has an elongated shape extending in the first direction FD adjacent one side of the stepped grooves R1 to R4. More specifically, in accordance with the embodiment of FIG. 10, each pair of memory blocks MB1 and MB2, the memory blocks MB1 and MB2 are divided by the slit SI, each memory block MB1 and MB2 has four stepped grooves R1 to R4 arranged along the first direction in the connection region CNR1, and an elongated open structure opening portion OP extends in the first direction FD over the slit SI. The opening portion OP is substantially co-extensive with the stepped grooves R1 to R4 along the first direction FD.

Referring to 11, the opening portions OP and the stepped grooves R1 to R4 may be disposed in the first and second memory blocks MB1 and MB2 of the second connection region CNR2 between the cell regions CR. The opening portions OP and the stepped grooves R1 to R4 may be alternately arranged along the first direction FD.

Figure 11:
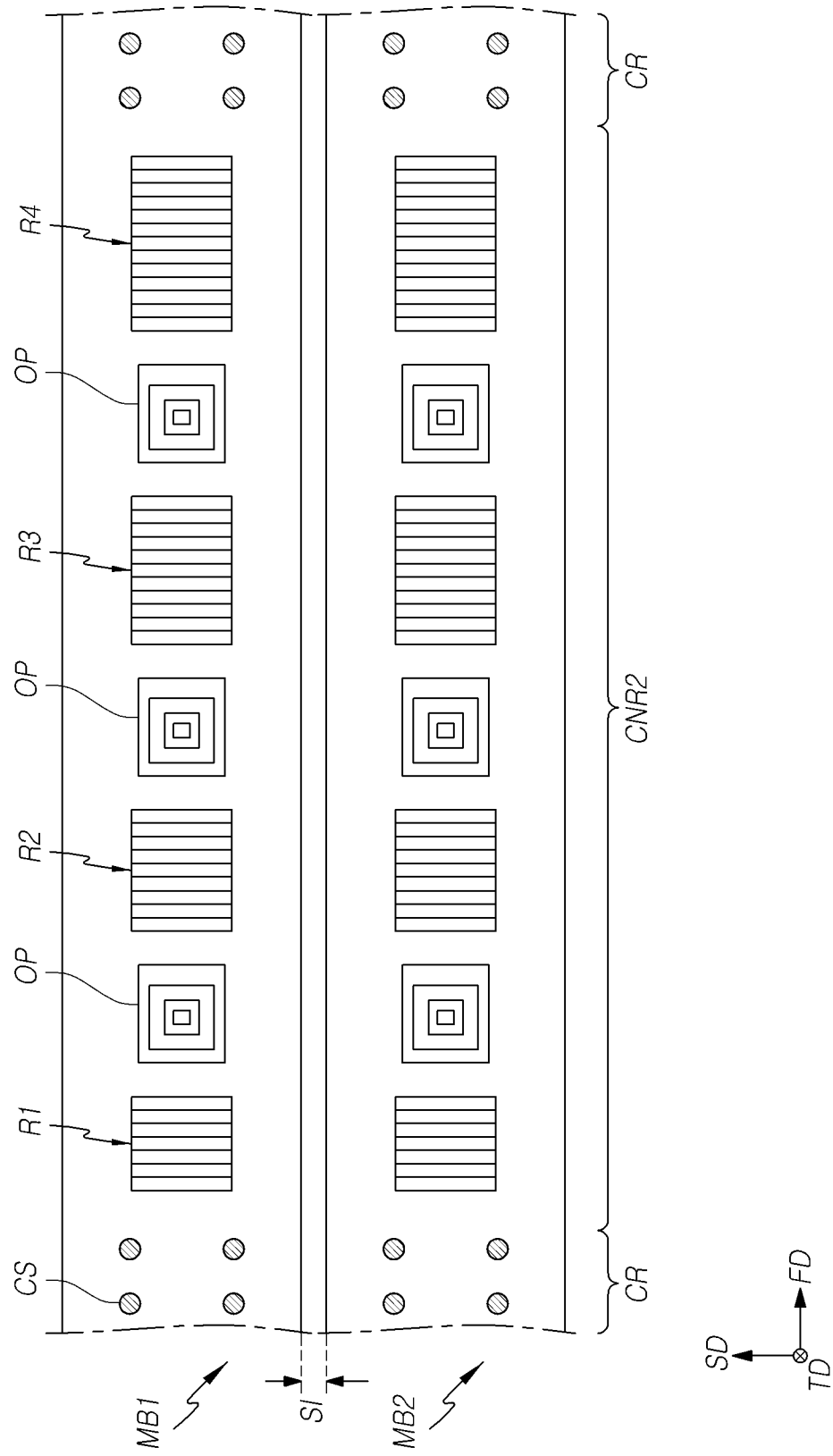

The opening portions OP may be disposed inside the first and second memory blocks MB1 and MB2 and may not be exposed to the sides of the first and second memory blocks MB1 and MB2. The opening portions OP may have the above-mentioned closed structure. Similar to the opening portions OP, the stepped grooves R1 to R4 may also be disposed inside the first and second memory blocks MB1 and MB2 and may not be exposed to the sides of the first and second memory blocks MB1 and MB2. In accordance with the illustrated embodiment of FIG. 11, in the second connection region CNR2, a closed structure opening portion is provided between every two consecutive stepped grooves in each of the memory blocks MB1 and MB2 with a total of three opening portions OP in each of the memory blocks MB1 and MB2. Each opening portion OP may be co-extensive in the second direction SD with the stepped grooves R1 to R4. Also, the length of each opening portion OP in the first direction may be the same, while the length of each stepped groove may be different. For example, as shown in FIG. 11, the second groove R2 may be longer than the first groove R1, the third groove R3 may be longer than the second groove R2, and the fourth groove R4 may be longer than the third groove R3 in the first direction FD. It is also noted that in accordance with the embodiment of FIG. 11, the opening portions OP and the stepped grooves R1 to R4 do not divide the conductive layers 41 and the interlayer insulating layers 42 of the first and second memory blocks MB1 and MB2.

When the stepped grooves R1 to R4 are disposed in the first and second memory blocks MB1 and MB2 of the second connection region CNR2 between the cell regions CR, if the conductive layers 41 of the first and second memory blocks MB1 and MB2 are divided by the stepped grooves R1 to R4, the additional wiring line for connecting between the divided conductive layers 41 will be required. In the present embodiment, the conductive layers 41 of the first and second memory blocks MB1 and MB2 are not divided by the stepped grooves R1 to R4, therefore no additional wiring line for connecting between the divided conductive layers 41 is required.

Figure 12:
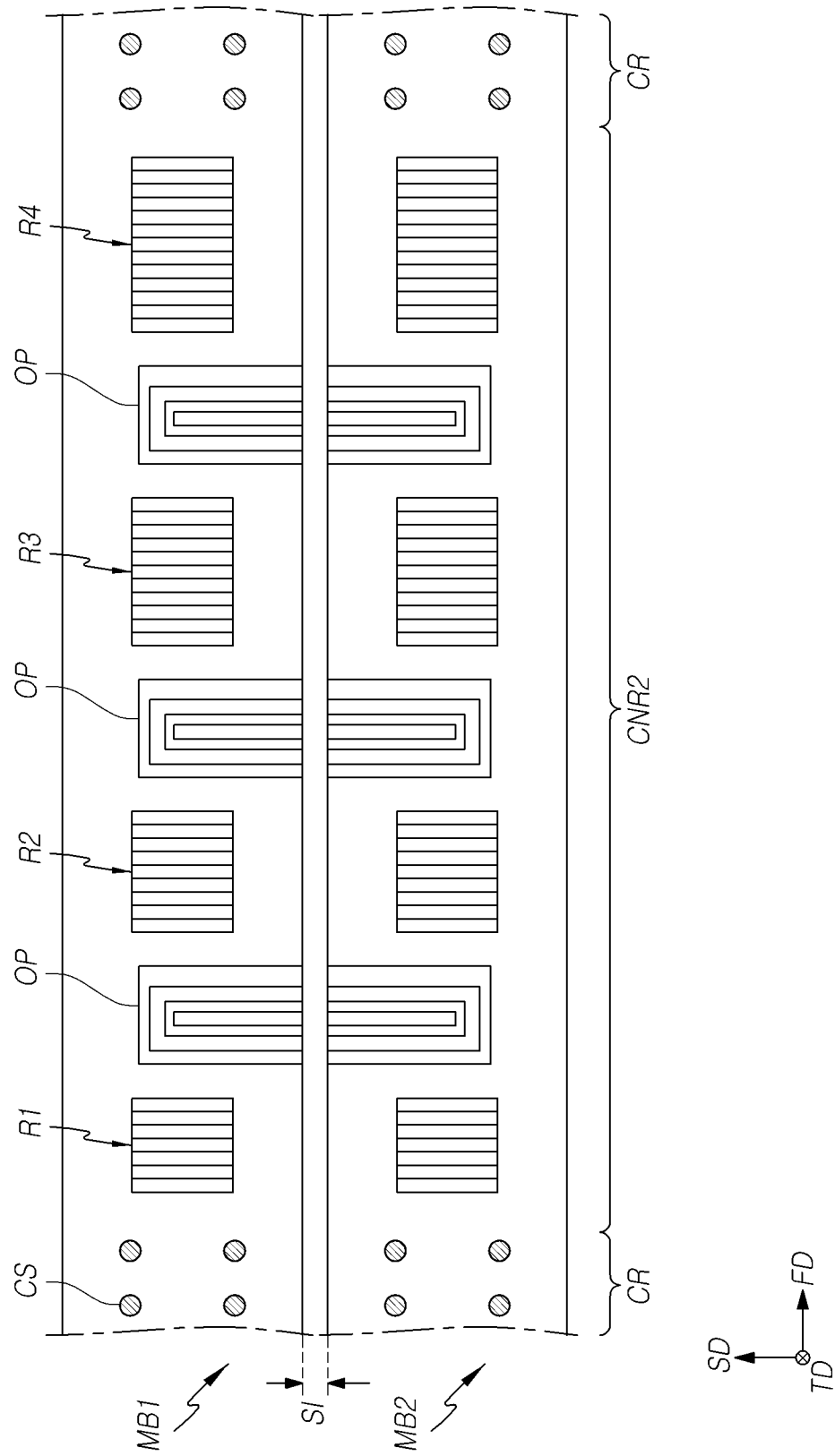

Referring to FIG. 12, the opening portions OP and stepped grooves R1 to R4 may be disposed in the first and second memory blocks MB1 and MB2 of the second connection region CNR2 between the cell regions CR. The openings OP and the stepped grooves R1 to R4 may be alternately arranged along the first direction FD.

The stepped grooves R1 to R4 may be disposed inside the first and second memory blocks MB1 and MB2 and may not be exposed to the sides of the first and second memory blocks MB1 and MB2. In this case, the stepped grooves R1 to R4 may not divide the conductive layers 41 and the interlayer insulating layers 42 of the first and second memory blocks MB1 and MB2. The opening portions OP may be exposed at the sides of the first and second memory blocks MB1 and MB2 and may be connected to a slit SI separating the first and second memory blocks MB1 and MB2. The openings OP may have the above-mentioned open structure. Each opening portion OP may have an elongated shape extending in the second direction SD.

Figure 13:
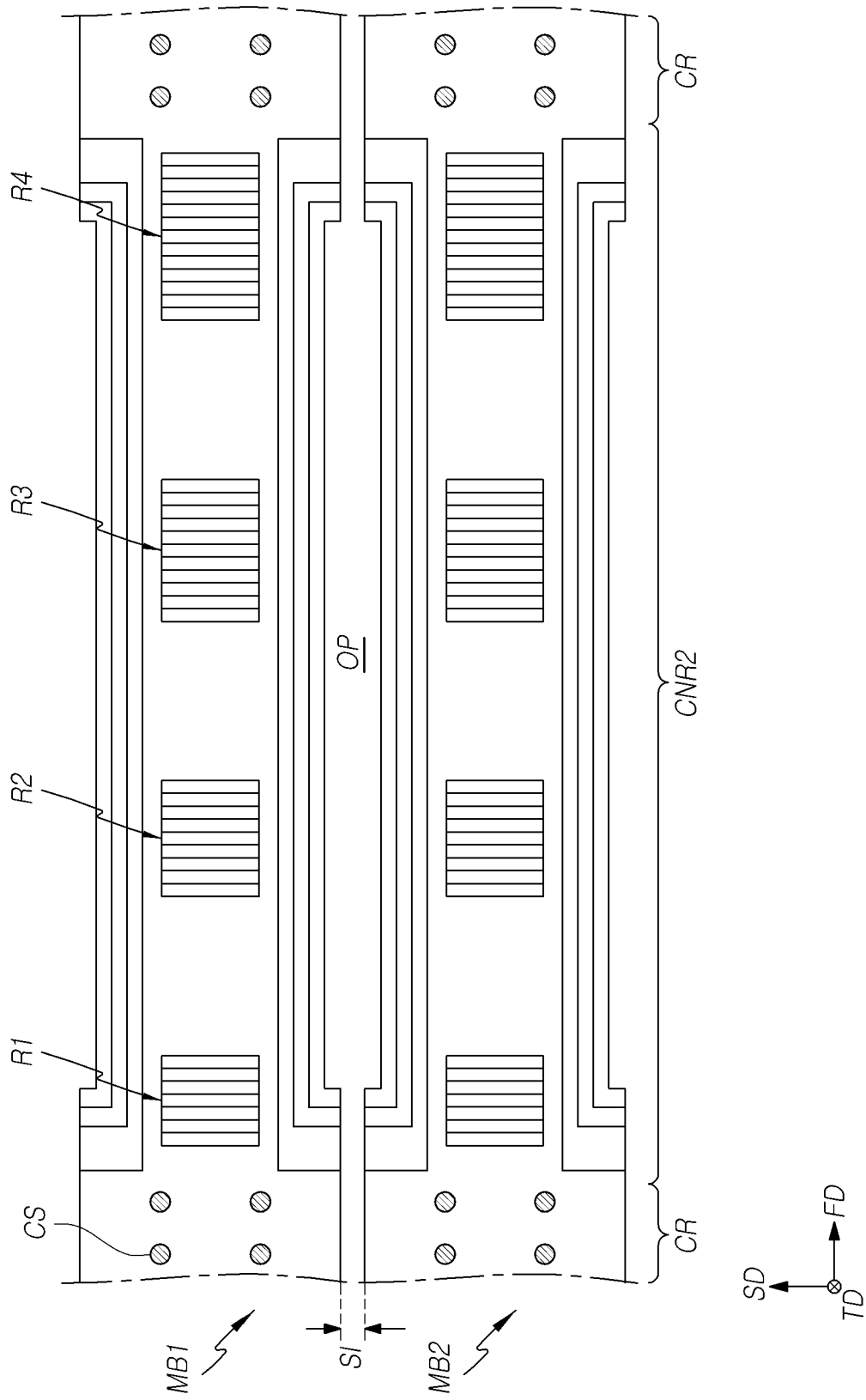

Referring to FIG. 13, the opening portion OP and the stepped grooves R1 to R4 may be disposed in the first and second memory blocks MB1 and MB2 of the second connection region CNR2 between the cell regions CR.

The stepped grooves R1 to R4 may be disposed inside the first and second memory blocks MB1 and MB2 and may not be exposed to the sides of the first and second memory blocks MB1 and MB2. In this case, the stepped grooves R1 to R4 do not divide the conductive layers 41 and the interlayer insulating layers 42 of the first and second memory blocks MB1 and MB2.

The openings OP may be disposed on both sides of the stepped grooves R1-R4 in the second direction SD and may be exposed to the sides of the first and second memory blocks MB1 and MB2. The openings OP may have the above-mentioned open structure. Each opening portion may have an elongated shape extending in the first direction FD similar to the shape of the opening portion OP of FIG. 10.

Figure 14:
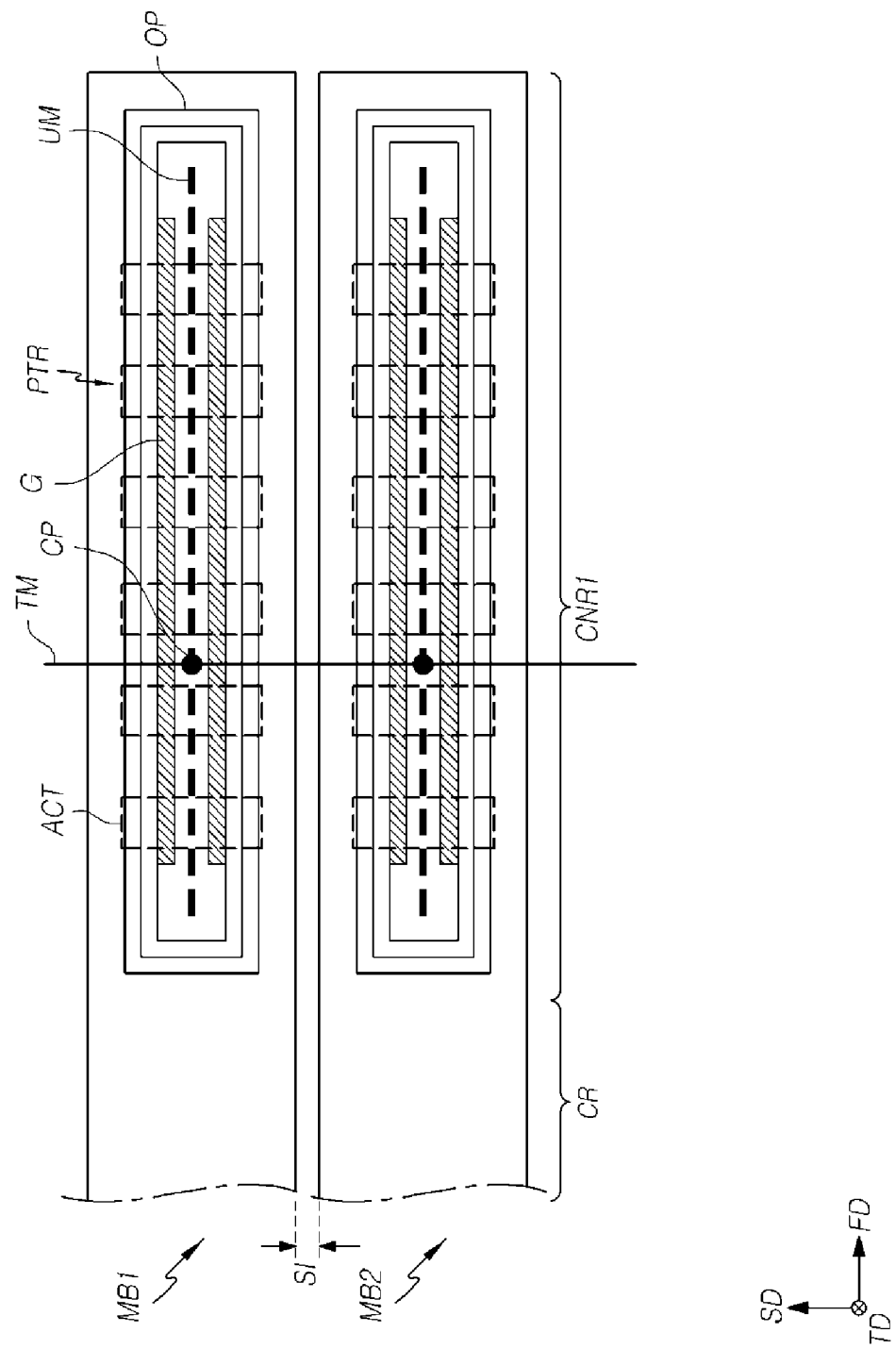

Referring to FIG. 14, in a first connection region CNR1 where the ends of the first and second memory blocks MB1 and MB2 are located, a plurality of active areas ACT may be disposed on a base layer (not shown) under each memory block MB1 and MB2. Gate lines G extending in the first direction FD across active areas ACT may be disposed over the base layer.

The active regions ACT may be arranged along the first direction FD under each of the first and second memory blocks MB1 and MB2, respectively. The gate lines G may have a line shape extending in the first direction FD across the active regions ACT. Impurity ions may be implanted into the active region ACT on both sides of the gate line G to form a source and a drain. The gate line G, the source and the drain may constitute a pass transistor (PTR) of the row decoder 120 in FIG. 1. As described above, the pass transistor PTR may function to transfer the operating voltage to the conductive layers of the first and second memory blocks MB1 and MB2.

The opening portion OP may be provided in the first and second memory blocks MB1 and MB2 of the first connection region CNR1. The lower wiring line UM connected to the pass transistors PTR may be disposed below the first and second memory blocks MB1 and MB2. The upper wiring line TM may be disposed above the first and second memory blocks MB1 and MB2. The lower wiring line UM may extend in the first direction FD. The upper wiring line TM may extend in the second direction SD. The lower wiring line UM and the upper wiring line TM may intersect from each other in the region where the opening portion OP is located.

The contact plug CP may be provided at an intersection between the lower wiring line UM and the upper wiring line TM. The contact plug CP may connect the upper wiring line TM and the lower wiring line UM through the opening portion OP. The opening portions OP can function as a passage for the contact plugs CP.

Two gate lines G may be positioned within the opening portion OP as viewed from the top. The opening portion OP may be aligned with respect to the gate lines G of the pass transistors PTR. The gate lines G may function as an align key in the process of forming the openings OP.

Figure 15:
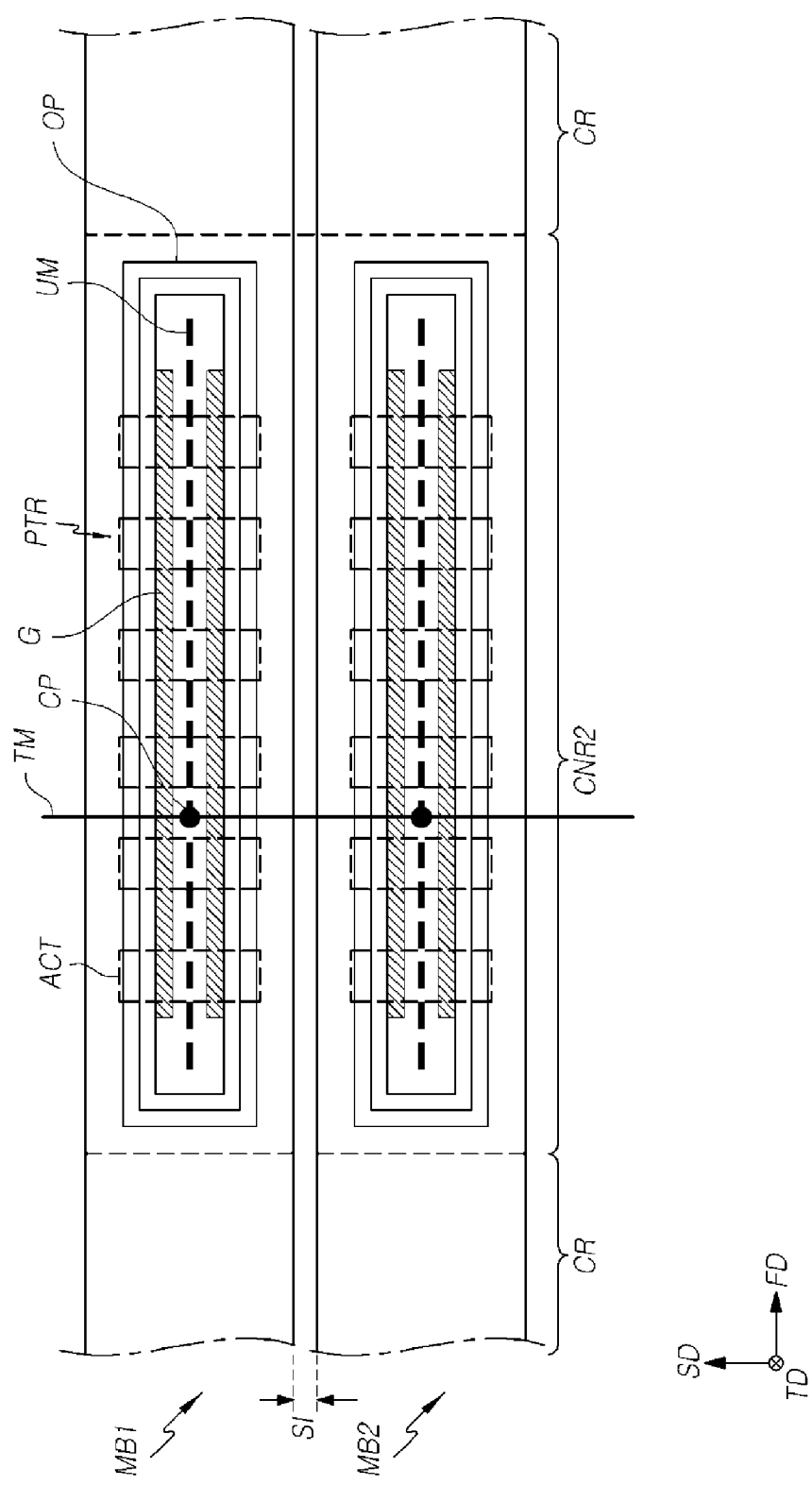

Referring to FIG. 15, the pass transistors PTR may be disposed in the second connection region CNR2 between the cell regions CR. The opening OP may be provided in the first and second memory blocks MB1 and MB2 in the second connection region CNR2. The opening OP may be aligned with respect to the gate lines G of the pass transistors PTR.

Figure 16:
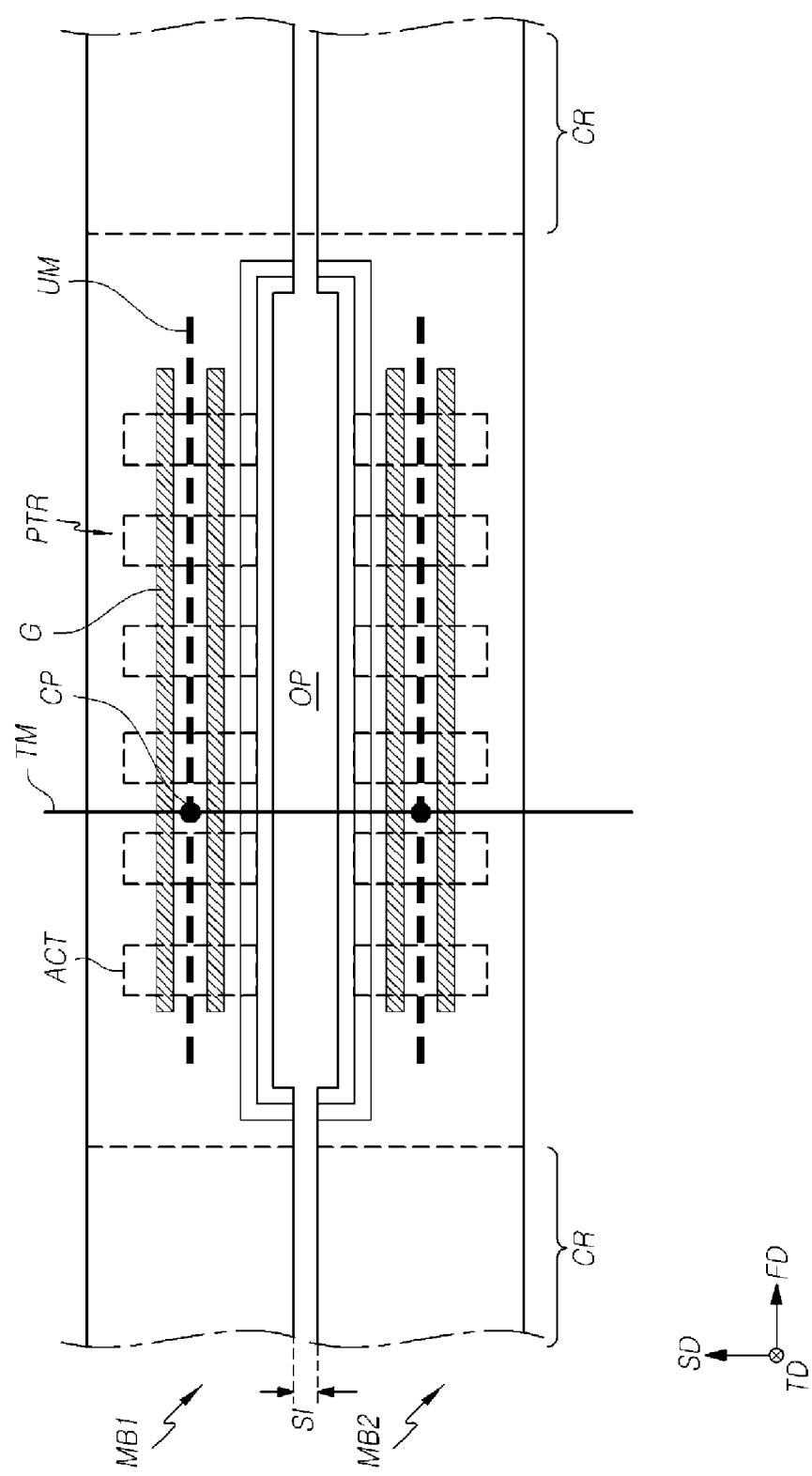

Referring to FIG. 16, the opening portion OP may be aligned with respect to a portion of the isolation layer between the active regions ACT under the first memory block MB1 and the active regions ACT under the second memory block MB2. The portion of the isolation layer between the active regions ACT under the first memory block MB1 and the active regions ACT under the second memory block MB2 may function as an align key in the process of forming the openings OP. In this case, the opening portion OP may be connected to the slit SI that divides the first memory block MB1 and the second memory block MB2. The opening OP may have the above-mentioned open structure.

Figure 17:
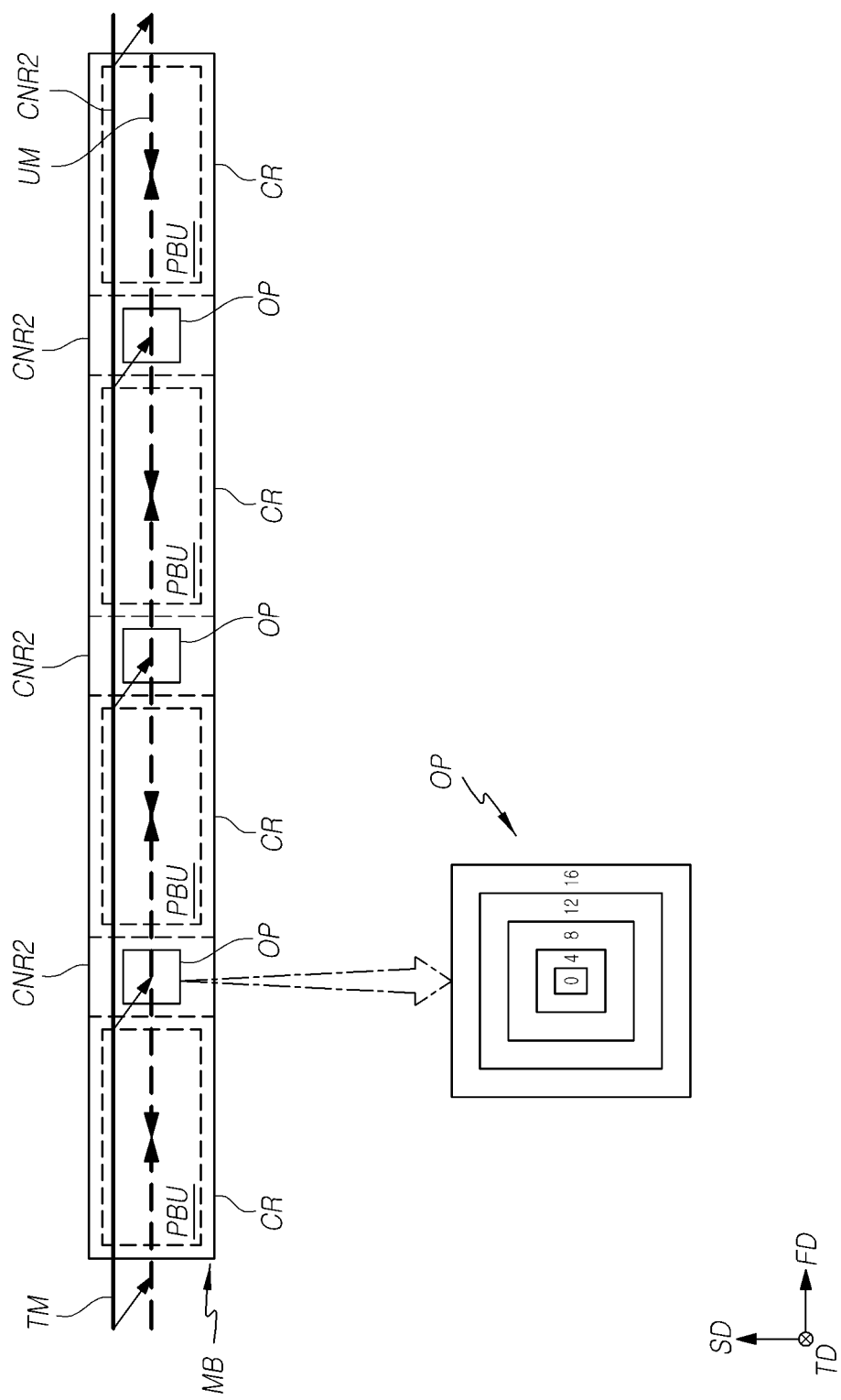

Referring to FIG. 17, the memory block MB may be disposed in cell regions CR and second connection regions CNR2 alternately arranged along the first direction FD.

Page buffer units PBU may be disposed in the cell regions CR under the memory block MB, respectively. The page buffer units PBU may be configured by dividing the page buffers into a predetermined unit (for example, 4 KB). The page buffers PB may constitute the page buffer circuit 220 described with reference to FIG. 1. The opening portions OP may be provided in the first and second memory blocks MB1 and MB2 in the second connection regions CNR2.

The lower wiring line UM connected to the page buffer units PBU may be disposed under the memory block MB. The upper wiring line TM may be disposed above the memory block MB. The lower wiring line UM and the upper wiring line TM may extend in the first direction FD and overlap each other in the third direction TD so that contact plugs CP passing through the opening portions OP in the third direction may connect the upper wiring line TM with the lower wiring line UM.

The lower wiring lines UM may be configured to have a physical property which may not show a process failure (for example, hillock) at a maximum temperature (hereinafter referred to as process threshold temperature) in the process of forming the memory block MB. For example, the lower wiring lines UM may be formed of conductive materials with suitable heat resistance characteristics at the process threshold temperature. For example, the bottom wiring lines UM may comprise a material having a melting point that is higher than the process threshold temperature, such as tungsten.

The conductive material constituting the upper wiring lines TM may have a lower resistivity than the conductive material constituting the lower wiring lines UM. For example, the material constituting the upper wiring lines TM may comprise a material having a low resistivity than tungsten. For example, the material constituting the upper wiring lines TM may comprise copper or aluminum. Since the upper wiring lines TM are formed after forming the memory block MB, a material having a low melting point and a low resistivity can be used as the conductive material constituting the upper wiring lines TM.

The resistivity of the lower wiring lines UM may have a relatively larger value than that of the upper wiring lines TM due to the manufacturing process limitations as described above. This may cause the electrical characteristics of the semiconductor memory device to deteriorate.

In accordance with an embodiment of the present disclosure, the page buffer units PBU may be configured by dividing the page buffers PB included in the page buffer circuit 220 into a predetermined unit (for example, 4 KB). The page buffer units PBU may be arranged in a plurality of cell regions CR, the opening portions OP may be arranged in a plurality of second connection regions CNR2 between the cell regions CR. And, contact plugs CP passing through the opening portions OP may connect between the upper wiring line TM and the lower wiring line UM. According to the above-described configuration, the length of the lower wiring UM can be reduced to less than the length of the cell region CR in the first direction FD or the page buffer unit PBU in the first direction FD.

In other words, the lower wiring line UM may have a length smaller than the length of the cell region CR in the first direction FD or the page buffer unit PBU in the first direction FD. For example, the length of the lower wiring lines UM may be half the length of the cell region CR in the first direction FD or the page buffer units PBU in the first direction FD. As a result, the resistance of the lower wiring lines (UM) may be reduced, so that the electrical characteristics of the semiconductor memory device may be improved.

In the embodiment described with reference to FIG. 17, the page buffer circuit 220 is distributed and arranged in a plurality of cell regions CR, but the present disclosure is not limited thereto. Elements constituting logic circuits except for the page buffer circuit 220, for example, the row decoder 210, may be distributed and arranged in the cell regions CR.

Figure 18:
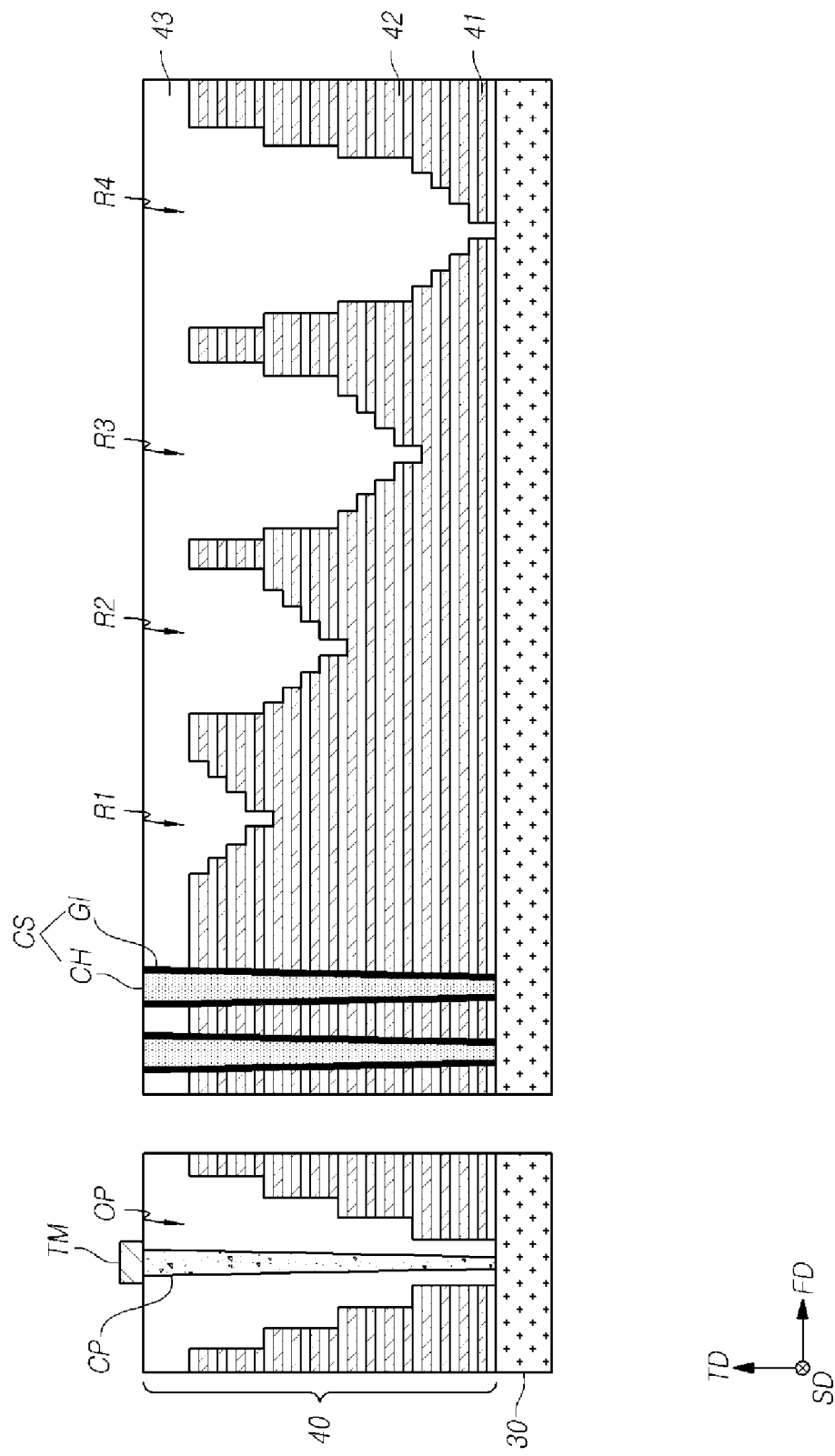
FIGS. 18 and 19 are cross-sectional views showing semiconductor memory devices in accordance with various embodiments of the present disclosure.

FIG. 18 is a cross-sectional view showing a semiconductor memory device in accordance with an embodiment of the present disclosure.

Referring to FIG. 18, the memory structure 40 may be disposed on a substrate 30. Four stepped grooves R1 to R4 and an opening portion OP may be provided in the conductive layers 41 and the interlayer insulating layers 42 of the memory structure 40. An upper insulating layer 43 may be disposed on the substrate 30 to cover the memory structure 40 and fill the first to the fourth stepped grooves R1 to R4 and the opening portion OP. The memory structure 40, the first to the fourth stepped grooves R1 to R4, the opening portion OP and the upper insulating layer 43 may have the same configuration described earlier with reference to FIG. 7.

The upper wiring line TM may be disposed on the upper insulating layer 43. The upper wiring line TM may be connected to the substrate 30 through the contact plug CP passing through the upper insulating layer 43 filled in the opening port OP. The contact plug CP may function to transfer a source voltage to be loaded to the upper wiring line TM to the substrate 30.

Figure 19:
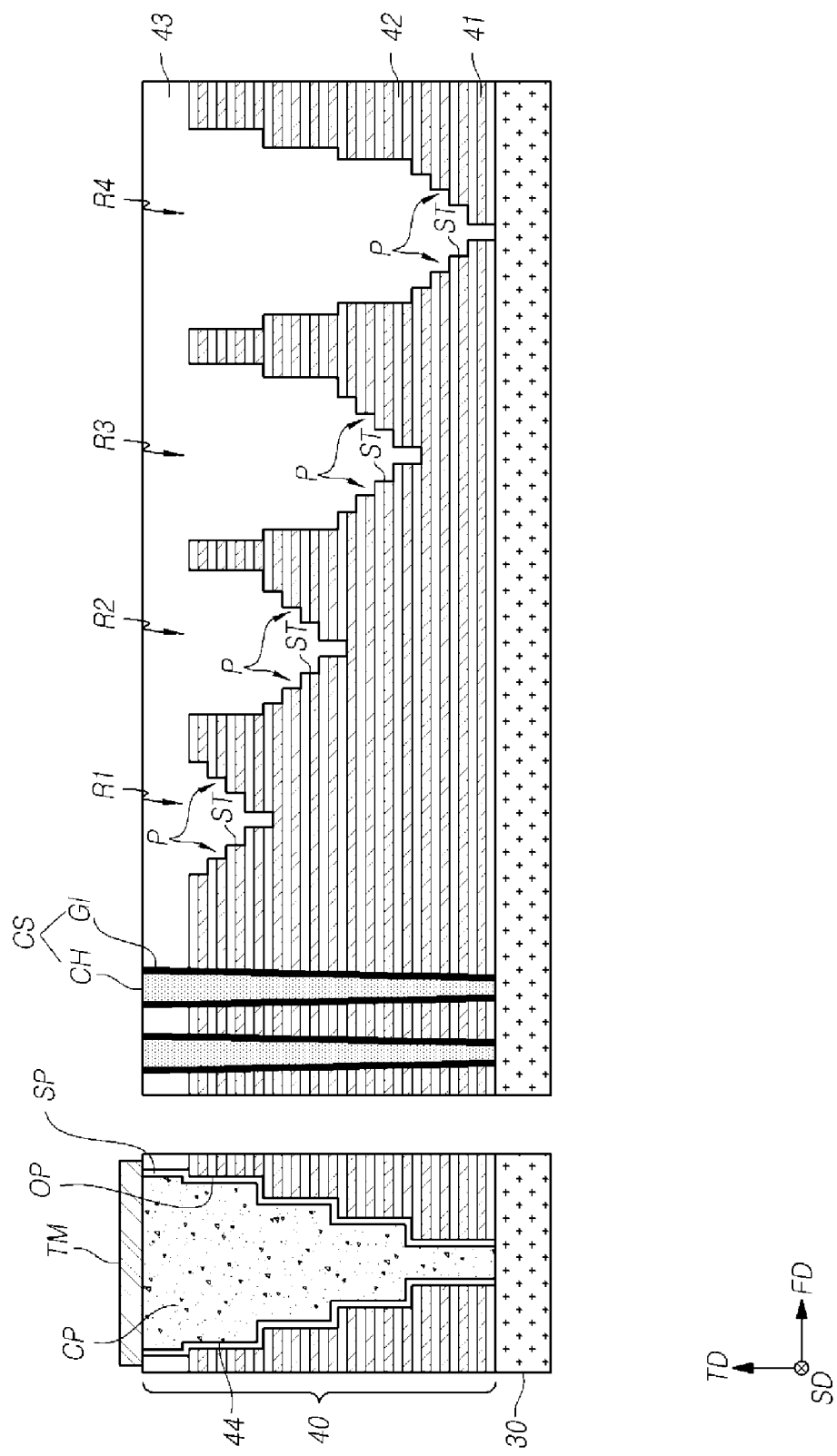

FIG. 19 is a cross-sectional view of a semiconductor memory device in accordance with an embodiment of the present disclosure.

Referring to FIG. 19, the memory structure 40 is disposed on a substrate 30. First to fourth stepped grooves R1 to R4 and opening portion OP may be disposed in the conductive layers 41 and the interlayer insulating layers 42 of the memory structure 40. An upper insulating layer 43 may be disposed on the substrate 30 to cover the memory structure 40 and fill the first to the fourth stepped grooves R1 to R4.

The upper insulating layer 43 may expose the opening portion OP. The opening portion OP may be filled with the contact plug CP. A sidewall insulating layer SP surrounding the outer wall of the contact plug CP may be disposed on the side wall of the contact plug CP to electrically isolate the conductive plugs 41 of the memory structure 40 from the contact plug CP. The sidewall insulating layer SP may have a uniform thickness along the surface curvature of the steps on the sidewall of the opening portion OP. The upper wiring line TM connected to the contact plug CP may also be disposed on the upper insulating layer 43.

FIGS. 20A to 20G are cross-sectional views for explaining a method of forming a semiconductor memory device in accordance with an embodiment of the present disclosure.

Hereinafter, for convenience of description, a region where the stepped grooves R1-R4 are formed may be defined as first to fourth stepped regions SR1 to SR4. A region where the opening portion OP is formed may be defined as the contact open region COR. In the accompanying drawings, the case where the contact open region COR is disposed on one side of the first to fourth stepped regions SR1 to SR4 in the first direction FD, but the present disclosure is not limited thereto. The contact open region COR may be disposed on one side of the first to fourth stepped regions SR1 to SR4 in the second direction SD. A plurality of contact open regions COR may be disposed in a plurality of regions between the first to the fourth stepped regions SR1 to SR4, respectively.

Referring to FIG. 20A, pre-stack ML may be formed by alternately stacking the first material layers 51 and the second material layers 52 on a substrate 30.

The first material layers 51 and the second material layers 52 may be formed of different materials from each other. For example, the second material layers 52 may be formed of a dielectric material that is suitable for interlayer dielectric layers. The first material layers 51 may be used as sacrificial layers and be formed of a dielectric material which has an etching selectivity with respect to the second material layers 52. For example, the first material layers 51 may be formed as silicon nitride. The second material layers 52 may be formed as silicon oxide.

A first mask pattern PR1 with a plurality of openings may be formed on the pre-stack ML. The first mask pattern PR1 may include four openings for respectively exposing the first to the fourth step regions SR1 to SR4. The first mask pattern PR1 may cover the contact open region COR.

The first mask pattern PR1 may be formed by forming a photoresist on the pre-stack ML, and patterning the photoresist by photolithography so as to expose portions of the first to fourth step regions SR1 to SR4, respectively.

Thereafter, the pre-stack ML may be etched by a pad etching process using the first mask pattern PR1 as an etch mask. The etching thickness of the pad etching process may correspond to the vertical pitch of the first material layers 51.

Then, a trimming process may be performed for the first mask pattern PR1. Namely, the isotropic etching process may be performed for the first mask pattern PR1. The trimming process may be performed using an etchant capable of removing the first mask pattern PR1. Accordingly, the height and width of the first mask pattern PR1 can be reduced, and the width of the openings can be widened by reducing the width of the first mask pattern PR1.

The pad etching process and the trimming process can constitute one cycle for forming one step ST in the first to fourth step regions SR1 to SR4.

Referring to FIG. 20B, the first stepped grooves R1 and preliminary second to fourth stepped grooves R2' to R4' may be formed in the first to fourth step regions SR1 to SR4, by repeating the cycle N times (N is a natural number of 2 or more).

Each of the first stepped groove R1 and preliminary second to fourth stepped grooves R2' to R4' may have a stepped structure P having a plurality of steps ST on both sides facing in the first direction FD. The stepped structures P of the first stepped groove R1 and the preliminary second to fourth stepped grooves R2' to R4' may include the same number of steps ST from each other. The height of each of the steps ST may have a size corresponding to the vertical pitch of the first material layers 51.

The first mask pattern PR1 may be removed after formation of the first stepped groove R1 and the preliminary second to fourth stepped grooves R2' to R4'.

Figure 20C:
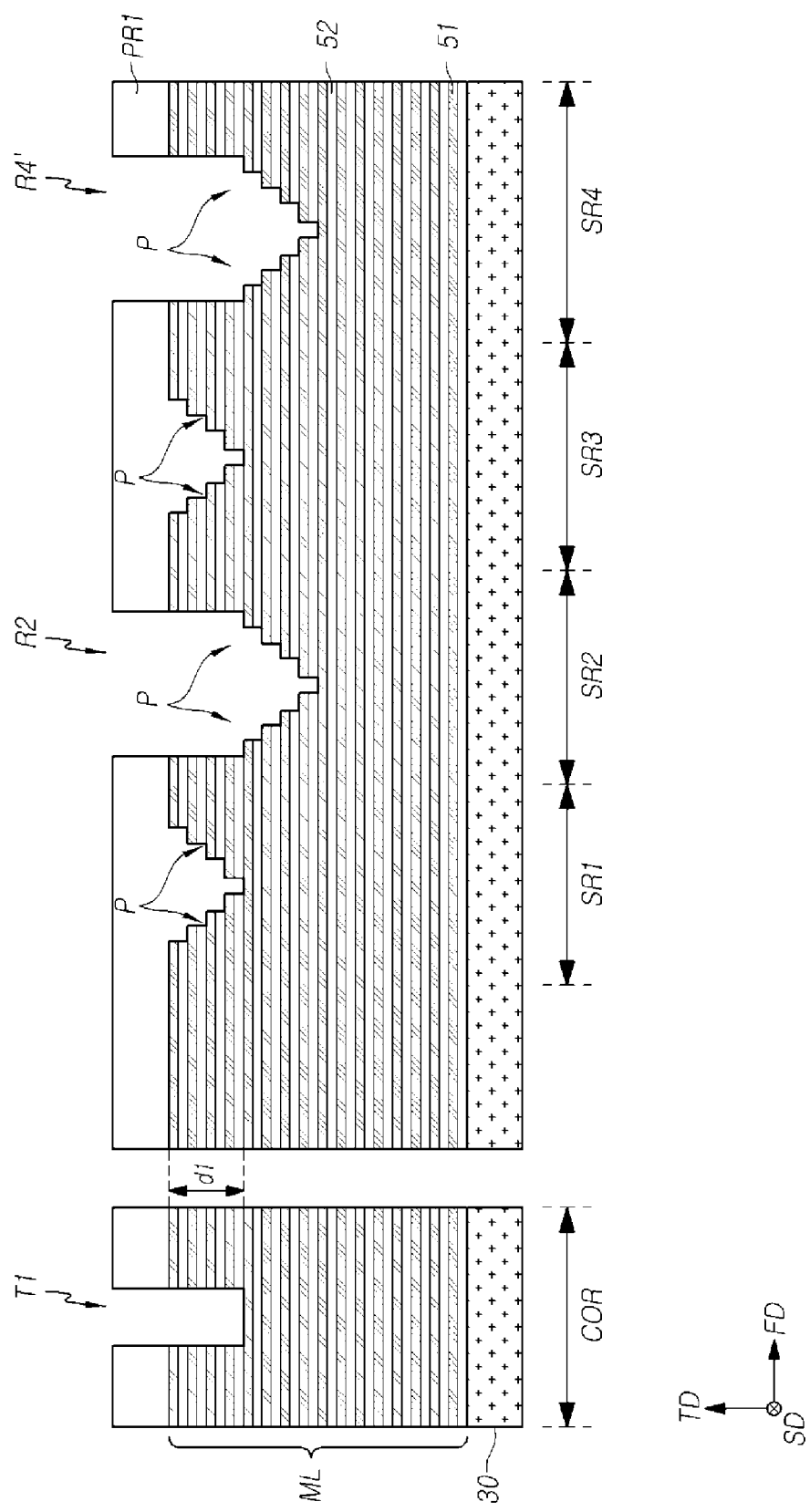

Referring to FIG. 20C, through a first recess etching process, the second stepped groove R2 having a depth greater than that of the preliminary second stepped groove R2' by the first depth d1 may be formed in the second stepped region SR2, a depth of the preliminary fourth stepped groove R4' in the second stepped region SR2 may be increased by the first depth d1, and a first trench T1 having the first depth d1 may be formed in the contact open region COR.

Here, the first depth d1 may be K times the vertical pitch of the first material layers 51. The K is a natural number which is greater than 2 and less than N+1. The N is the number of the cycle repetitions. The first recess etching process may be performed in the following manner.

First, a second mask pattern PR2 including a plurality of openings exposing the preliminary second and fourth stepped grooves R2' and R4' and a portion of the contact open region COR may be formed on the pre-stack ML.

The preliminary second and fourth stepped grooves R2' and R4' may be used as an alignment key in forming the openings of the second mask pattern PR2. For this purpose, the openings of the second mask pattern PR2, which exposes the preliminary second and fourth stepped grooves R2' and R4' may have an area larger than the entrance of preliminary second and fourth stepped grooves R2' and R4', respectively. Subsequently, the pre-stack ML may be etched by the first depth d1 using the second mask pattern PR2 as an etching barrier.

The second mask pattern PR2 may be formed using a photolithographic process and may be removed after the first recess etching process.

Figure 20D:
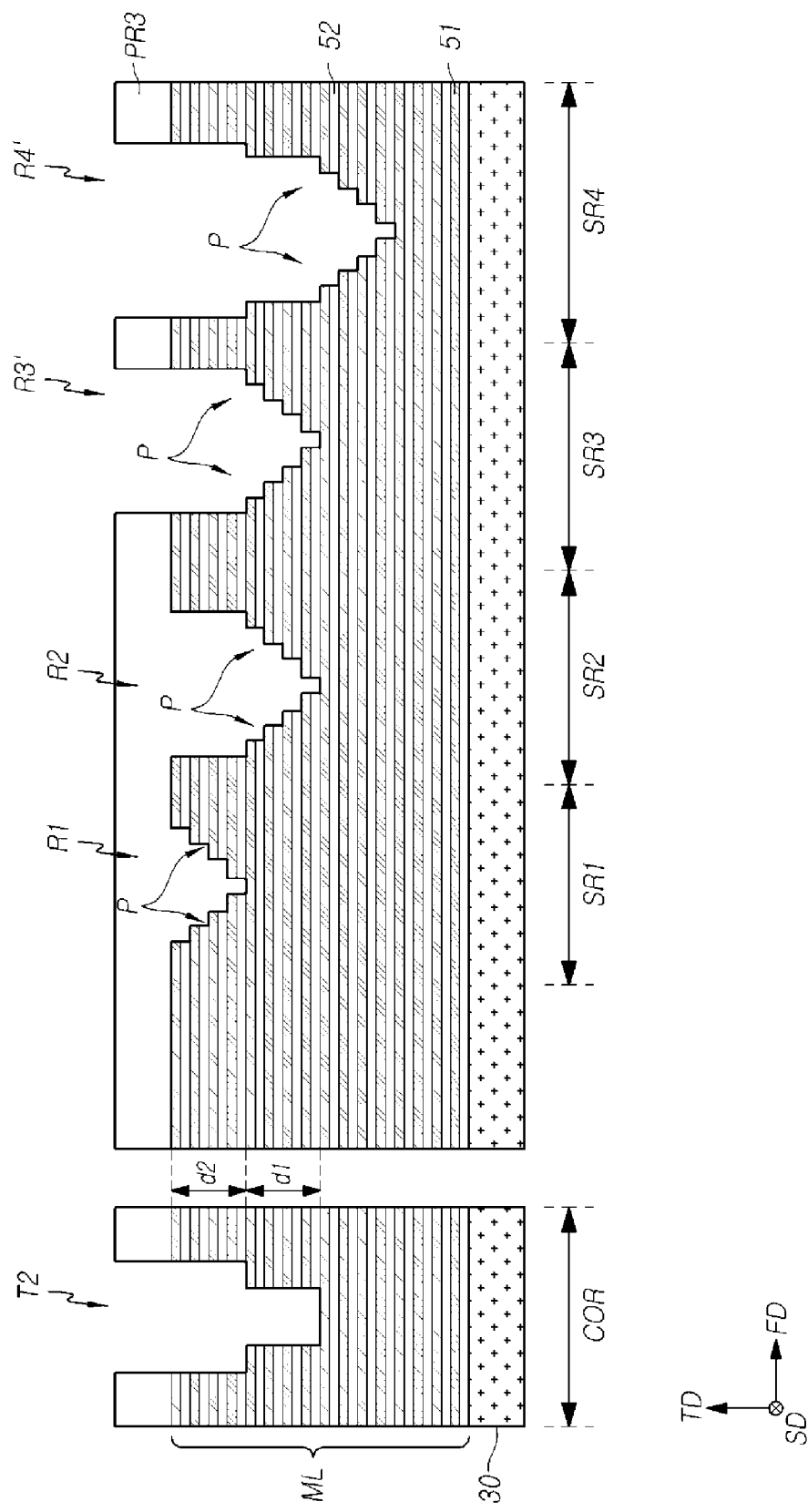

Referring to FIG. 20D, through a second recess etching process, depths of the preliminary stepped grooves, i.e., the preliminary third and fourth stepped grooves R3' and R4' may be increased by the second depth d2, and a second trench T2 having a depth greater than that of the first trench T1 by the second depth d2 may be formed in the contact open region COR.

The second depth d2 may be K times the vertical pitch of the first material layers 51. The K is a natural number which is greater 2 and less than N+1. The N is the number of the cycle repetitions. In this embodiment, the case where the second depth d2 is equal to the first depth d1 is shown, however, the invention may not be limited in this way and d2 may be different than D1 by design.

The second recess etching process may be performed in the following manner. First, a third mask pattern PR3 including a plurality of openings is formed on the pre-stack ML. For example, there is formed the third mask pattern PR3 having openings exposing the preliminary third and fourth stepped grooves R3' and R4' and the first trench T1 on the pre-stack ML.

The preliminary third and fourth stepped grooves R3' and R4', and the first trench T1 may be used as an alignment key in forming the openings of the third mask pattern PR3. For this purpose, the openings of the third mask pattern PR3, which exposes the preliminary third and fourth stepped groove R3' and R4', and the first trench T1 may have an area larger than the entrance of the preliminary third and fourth stepped groove R3' and R4', and the first trench T1, respectively.

Next, the pre-stack ML is etched by the second depth d2 using the third mask pattern PR3 as an etching barrier. Thus, a step having a height corresponding to the second depth d2 is formed on the sidewalls of the preliminary third stepped groove R3', the preliminary fourth stepped groove R4', and the second trench T2.

Due to the difference between the opening area of the third mask pattern PR3 exposing the preliminary third stepped groove R3' and the entrance area of the preliminary third stepped groove R3', the width of the preliminary third stepped groove R3' in the first direction FD may be increased as the distance from the substrate 30 is increased. Due to the difference between the opening area of the third mask pattern PR3 exposing the preliminary fourth stepped groove R4' and the entrance area of the preliminary fourth stepped groove R4', the width of the preliminary fourth stepped groove R4' in the first direction FD may be increased as the distance from the substrate 30 may be increased. And, due to the difference between the opening area of the third mask pattern PR3 exposing the first trench T1 and the entrance area of the first trench T1, the widths of the second trench T2 in the first and the SD may be increased.

Figure 20E:
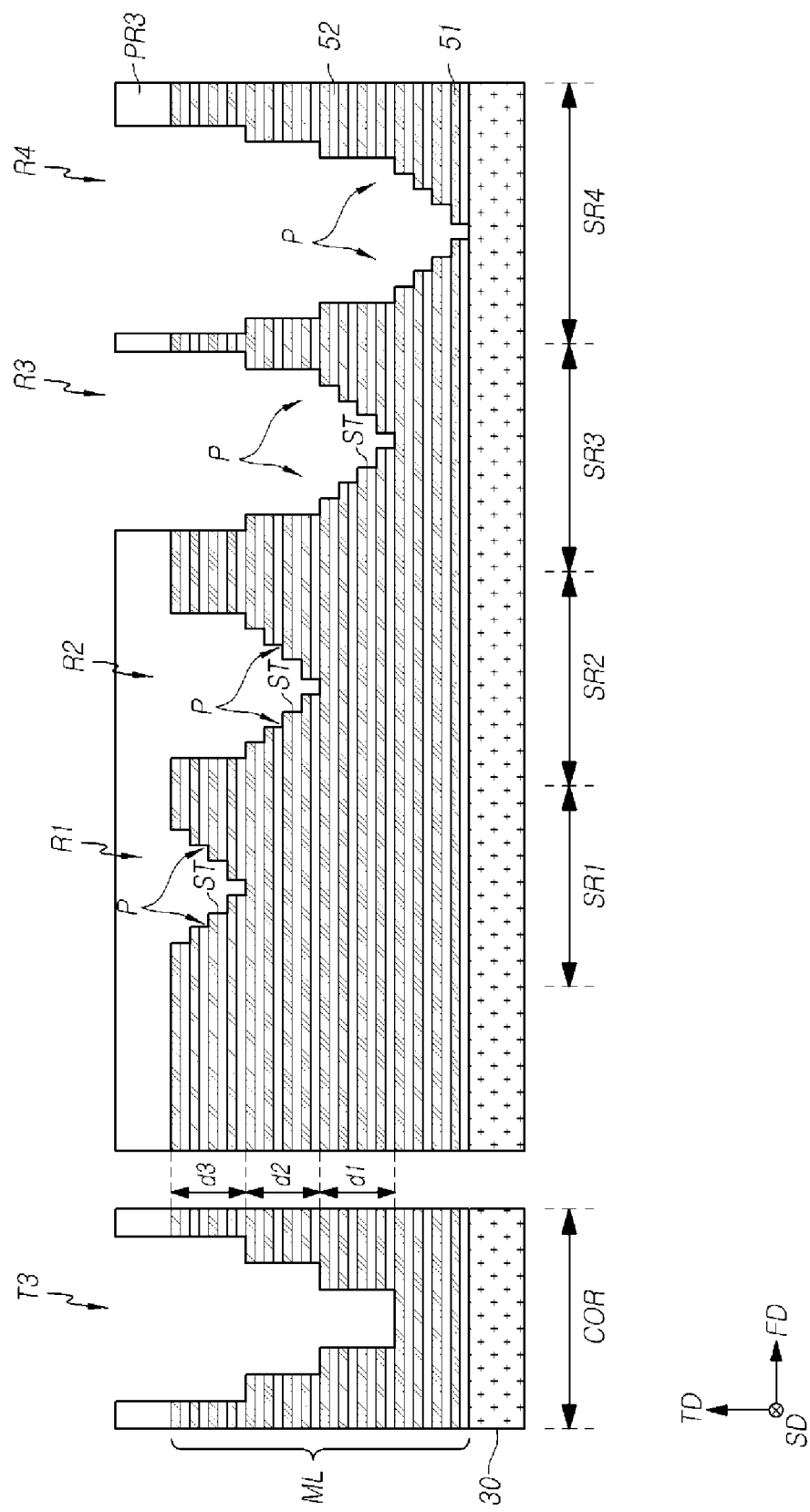

Referring to FIG. 20E, through a third recess etching process, depths of the preliminary third and fourth stepped grooves R3', R4' and the second trench T2 may be increased by the third depth d3, so that a third stepped groove R3 having a depth greater than that of the preliminary third stepped grooves R3' may be formed in the third stepped region SR3, a fourth stepped groove R4 having a depth greater than that of the preliminary fourth stepped groove R4' may be formed in the fourth stepped region SR4, and a third trench T3 having a depth greater than that of the second trench T2 may be formed in the contact open region COR.

The third depth d3 may be K times the vertical pitch of the first material layers 51. The K is a natural number which is greater than 2 and less than N+1 or less. The N is the number of the cycle repetitions. In this embodiment, the case where the third depth d3 is equal to the first depth d1 is shown, however, the invention may not be limited in this way and the third depth d3 may be formed different than the first depth d1 by design.

The third recess etching process may be performed in the following manner. First, a trimming process for widening the opening width of the third mask pattern PR3 is performed. By the trimming process, the opening of the third mask pattern PR3 exposing the preliminary third stepped groove R3' will have an area larger than the entrance of the preliminary third stepped groove R3', the opening of the third mask pattern PR3 exposing the preliminary stepped groove R4' will have an area larger than the entrance of the preliminary fourth stepped groove R4', and the opening of the third mask pattern PR3 exposing the second trench T2 will have an area larger than the entrance of the second trench T2.

Next, the pre-stack ML may be etched by the third depth d3 using the trimmed third mask pattern PR3 as an etching barrier, so the third and fourth stepped grooves R3 and R4 and third trench T3 may be formed. Thus, the step having a height corresponding to the third depth d3 is formed on the sidewalls of the third and fourth stepped grooves R3 and R4 and third trench T3, respectively.

Due to the difference between the opening area of the trimmed third mask pattern PR3 exposing the preliminary third stepped groove R3' and the entrance area of the preliminary third stepped groove R3', the width of the third stepped groove R3 in the first direction FD may be increased as the distance from the substrate 30 is increased. Due to the difference between the opening area of the trimmed third mask pattern PR3 exposing the preliminary fourth stepped groove R4' and the entrance area of the preliminary fourth stepped groove R4', the width of the fourth stepped groove R4 in the first direction FD may be increased as the distance from the substrate 30 may be increased. And, due to the difference between the opening area of the trimmed third mask pattern PR3 exposing the second trench T2 and the entrance area of the second trench T2, the widths of the third trench T3 in the first and the second directions FD and SD may be increased.

The third mask pattern PR3 may be formed using a photolithographic process and may be removed after the second recess etching process.

Referring to 20F, through a fourth recess etching process, the opening portion OP exposing the substrate 30 may be formed in the contact open region COR.

The fourth recess etching process can be performed in the following manner. First, a fourth mask pattern PR4 having an opening exposing the third trench T3 is formed on the pre-stack ML. The opening of fourth mask pattern PR4 exposing the third trench T3 may have an area larger than the entrance of the third trench T3.

Next, the pre-stack ML may be etched using the fourth mask pattern PR4 as an etching barrier to form the opening portion OP exposing the substrate 30.

Channel structures (not shown) vertically penetrating the pre-stack ML may be formed, the first material films 51 used as the sacrificial layer may be removed, and then the conductive layers 41 are formed by filling conductive material into the space where the first material films 51 are removed.

As described above, in accordance with the present embodiment, the opening portion OP is simultaneously formed through the process of etching the second to fourth stepped grooves R2 to R4 so that a mask forming process and an etching process are not separately required to form the opening portion OP. Since there is no need to add a separate mask forming process and etching process, the number of process steps is reduced so that the manufacturing time and manufacturing cost of the semiconductor memory device can be decreased.

Since the opening portions OP are formed by etching the pre-stack ML several times, the depth required to be etched in the single etching process is reduced so that pattern collapse occurring in the etching process can be suppressed and the yield of the semiconductor memory device can be improved.

The embodiments described with reference to FIGS. 4 to 20G illustrate the case where the number of the stepped grooves (R1 to R4) is four, but the present invention is not limited thereto. It should be understood that the number of the stepped grooves may be changed by design.

The present disclosure may include all cases with two or more stepped grooves. In the embodiments described with reference to FIGS. 4 to 20G, the stepped grooves R1 having the lowest depth are disposed at the leftmost side in the first direction FD, and the stepped grooves R1 to R4 are sequentially deepened from left to right, and the stepped grooves R4 having the deepest depth are disposed on the rightmost side in the first direction FD. However, the present disclosure is not limited thereto. For example, in a variation of the described embodiments, the stepped grooves having the deepest depth may be disposed at the leftmost side in the first direction FD and the depths of the stepped grooves may be gradually reduced from left to right so that the stepped groove having the lowest depth may be disposed on the rightmost side in the first direction (FD). In yet another variation of the described embodiments, the stepped grooves may be randomly arranged regardless of their depth.

Figure 21:
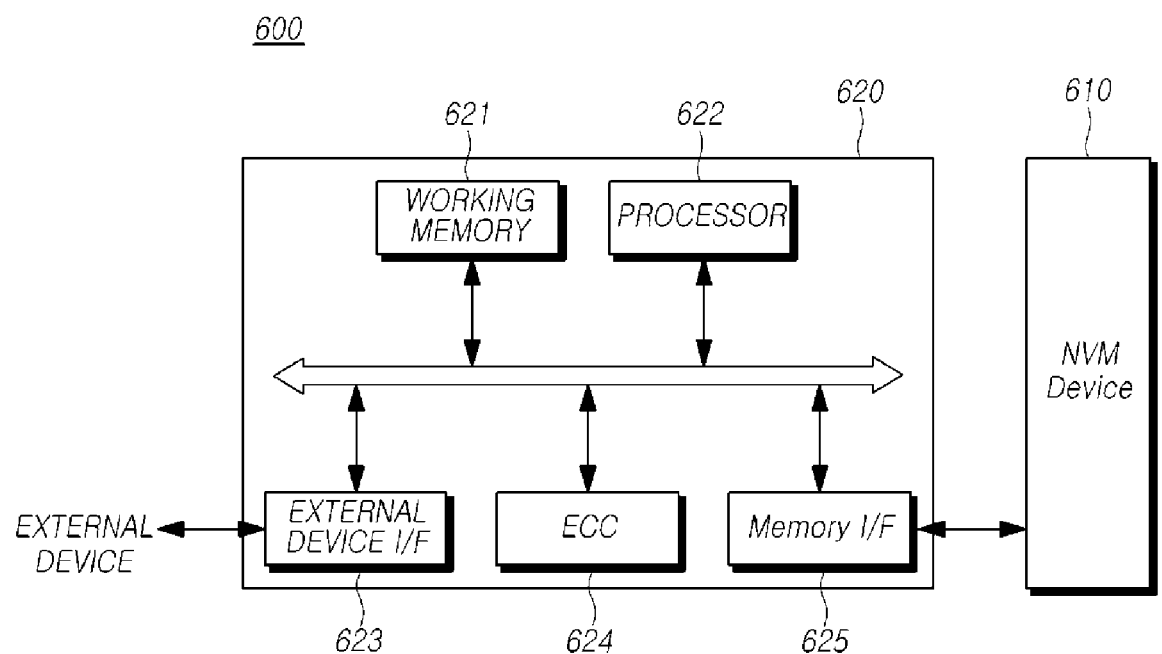
FIG. 21 is a block diagram schematically illustrating a memory system including a semiconductor memory device in accordance with an embodiment of the present disclosure.

FIG. 21 is a simplified block diagram schematically illustrating a memory system in accordance with yet another embodiment of the present disclosure.

Referring to FIG. 21, a memory system 600 in accordance with may include semiconductor memory device 610 and memory controller 620.

The semiconductor memory device 610 may be comprised of the semiconductor memory device in accordance with the embodiments of the disclosure as described above and may be operated in the manner described above, referred to FIGS. 1 to 20. The memory controller 620 may control the semiconductor memory device 610. For example, the combination of the semiconductor memory device 610 and the memory controller 620 may be configured as a memory card or a solid state disk (SSD).

The memory controller 620 may include a working memory 621, a processor 622, an external device interface 623, an error correction circuit ECC block 624, and a memory interface 625.

The working memory 621 may be used as the operation memory of the processor 622. The external device interface 623 may include a data exchange protocol of an external device coupled with the memory system 600.

The ECC block 624 may detect and correct an error included in the data read out from the semiconductor memory device 610.

The memory interface 625 may interface with the semiconductor memory device 610. The processor 622 may perform general control operations for data exchange of the memory controller 620.

Although not shown, it should become apparent to a person skilled in the art that the memory system 600 may further be provided with a ROM which stores code data for interfacing with the external device. The semiconductor memory device 610 may be provided as a multi-chip package constructed by a plurality of flash memory chips.

The memory system 600 may be used as a storage medium of high reliability having a low probability of an error occurring. The semiconductor memory device 610 may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 22:
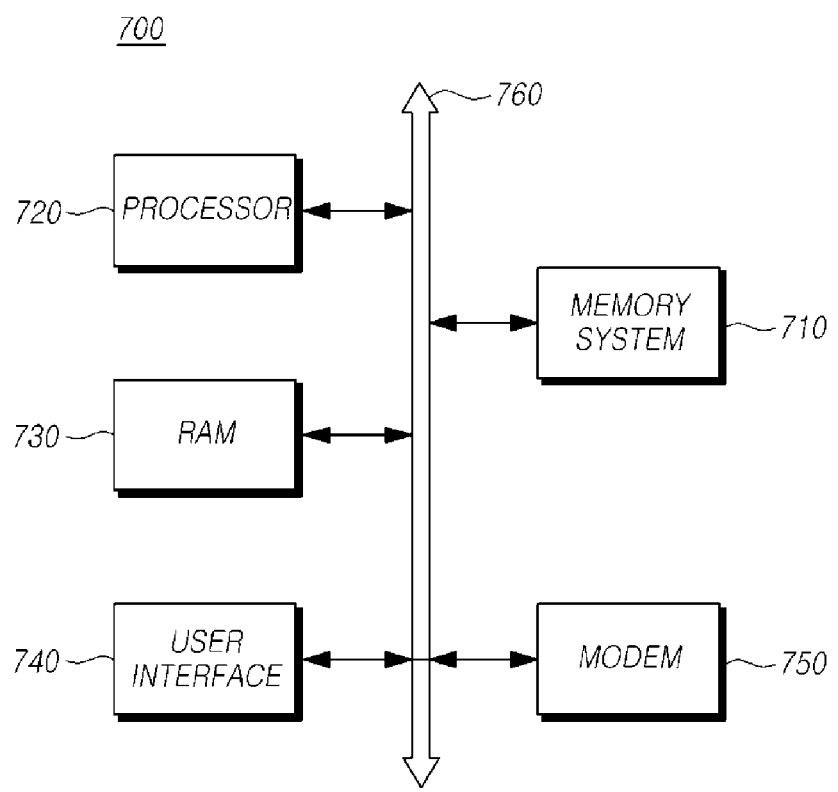
FIG. 22 is a block diagram schematically illustrating a computing system including a semiconductor memory in accordance with an embodiment of the present disclosure.

FIG. 22 is a simplified block diagram schematically illustrating a computing system in accordance with yet another embodiment of the present disclosure.

Referring to FIG. 22, a computing system 700 may include a memory system 710, a processor 720, a RAM 730, a user interface 740, and a modem 750 such as a baseband chipset all of which may be electrically coupled to a system bus 760. The computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CMOS image sensor (CIS), a mobile DRAM, and so on.

The memory system 710 may be comprised of the memory system 600 with a memory device 610 and a memory controller 620 in accordance with embodiment of FIG. 21 and may be operated in the manner described above with reference to FIG. 21.

The memory system 710 may be configured in a number of different ways such as, for example, as an SSD (solid state drive/disk) which uses a nonvolatile memory to store data, or, as another example, as a fusion flash memory (for example, a NAND or a NOR flash memory).

It is not intended that the above-described embodiments are realized only by a device and a method, but they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:
1. A method of manufacturing a semiconductor device, the method comprising:
forming a pre-stack by alternately stacking first material layers and second material layers on a substrate;

forming a plurality of stepped grooves each having a step structure in the pre-stack;
recessing the stepped grooves to have different depths from each other;
forming an opening portion in the pre-stack, the opening portion having at least one step on a sidewall thereof having a same height as a depth difference between two of the stepped grooves.

2. The method of claim 1, wherein the recessing the stepped grooves and the forming the opening portion are simultaneously performed.

3. The method of claim 1, wherein the forming of the stepped grooves includes:
forming a first mask pattern including a plurality of first openings on the pre-stack;
etching the pre-stack by using the first mask pattern; and
performing a trimming process widening the widths of the first openings,
wherein the etching of the pre-stack and the performing of the trimming process are alternately repeated.

4. The method of claim 3, wherein in the etching of the pre-stack, the etching depth corresponds to a vertical pitch of the first material layer.

5. The method of claim 1, wherein the forming of the opening portion includes;
forming a second mask pattern including second openings exposing at positions corresponding to at least one of the stepped grooves and the opening portion;
increasing depths of the stepped grooves exposed by the second mask pattern by a first depth and forming a trench of the first depth at a position corresponding to the opening portion, by first etching the pre-stack using the second mask pattern as an etch mask;
forming a third mask pattern including third openings exposing at least one of the stepped grooves and the trench; and
increasing depths of the trench and stepped grooves exposed by the third mask pattern by a second depth, by second etching the pre-stack using the third mask pattern as an etch mask.

6. The method of claim 5, wherein an area of the second opening of the second mask pattern exposing the stepped groove is larger than an entrance area of the stepped groove.

7. The method of claim 5, wherein an area of the third opening of the third mask pattern exposing the recessed stepped groove is larger than an entrance area of the recessed stepped groove, and the area of the third opening of the third mask pattern exposing the trench is larger than an entrance of the trench.

8. The method of claim 5, wherein the etching depths of the first etching and the second etching are K times the vertical pitch of the first material layer,
wherein K is a natural number which is greater than 2 and less than N+1, and
wherein N is the number of steps of the step structure.

* * * * *